(12) United States Patent
Lin et al.

(10) Patent No.: US 12,363,933 B2
(45) Date of Patent: Jul. 15, 2025

(54) DIELECTRIC STRUCTURES IN SEMICONDUCTOR DEVICES

(71) Applicant: Taiwan Semiconductor Manufacturing Company, Ltd, Hsinchu (TW)

(72) Inventors: Chien-Hung Lin, Hsinchu (TW); Ko-Feng Chen, Hsinchu (TW); Keng-Chu Lin, Ping-Tung (TW)

(73) Assignee: Taiwan Semiconductor Manufacturing Company, Ltd.

( * ) Notice: Subject to any disclaimer, the term of this patent is extended or adjusted under 35 U.S.C. 154(b) by 651 days.

(21) Appl. No.: 17/591,413

(22) Filed: Feb. 2, 2022

(65) Prior Publication Data

US 2023/0009144 A1   Jan. 12, 2023

Related U.S. Application Data

(60) Provisional application No. 63/222,785, filed on Jul. 16, 2021, provisional application No. 63/219,956, filed on Jul. 9, 2021.

(51) Int. Cl.
| | |
|---|---|
| H10D 30/01 | (2025.01) |
| H01L 21/306 | (2006.01) |
| H01L 21/762 | (2006.01) |
| H10D 30/62 | (2025.01) |
| H10D 62/10 | (2025.01) |

(52) U.S. Cl.
CPC ..... *H10D 30/024* (2025.01); *H01L 21/30604* (2013.01); *H01L 21/762* (2013.01); *H10D 30/62* (2025.01); *H10D 62/115* (2025.01); *H10D 62/118* (2025.01)

(58) Field of Classification Search
CPC ......... H01L 21/30604; H01L 29/66795; H01L 21/762; H01L 29/0649; H01L 29/0665; H01L 29/785; H10D 30/024; H10D 62/118; H10D 30/62; H10D 62/115
USPC .............................................. 257/401
See application file for complete search history.

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |

(Continued)

*Primary Examiner* — Igwe U Anya
(74) *Attorney, Agent, or Firm* — Sterne, Kessler, Goldstein & Fox P.L.L.C.

(57) ABSTRACT

A semiconductor device with densified dielectric structures and a method of fabricating the same are disclosed. The method includes forming a fin structure, forming an isolation structure adjacent to the fin structure, forming a source/drain (S/D) region on the fin structure, depositing a flowable dielectric layer on the isolation structure, converting the flowable dielectric layer into a non-flowable dielectric layer, performing a densification process on the non-flowable dielectric layer, and repeating the depositing, converting, and performing to form a stack of densified dielectric layers surrounding the S/D region.

20 Claims, 21 Drawing Sheets

(56) References Cited

U.S. PATENT DOCUMENTS

| | | | | |
|---|---|---|---|---|
| 2017/0110577 A1* | 4/2017 | Wang | ................... | H10D 84/038 |
| 2018/0330980 A1* | 11/2018 | Liang | ................ | H01L 21/76224 |
| 2020/0006063 A1* | 1/2020 | Chen | ................ | H01L 21/02373 |
| 2020/0006558 A1* | 1/2020 | Wu | ................ | H01L 21/823814 |
| 2020/0126987 A1* | 4/2020 | Rubin | ................ | H01L 29/0847 |
| 2020/0381537 A1* | 12/2020 | Lin | .................... | H01L 21/3065 |
| 2021/0305381 A1* | 9/2021 | Chiang | ............. | H01L 29/78696 |
| 2021/0359091 A1* | 11/2021 | Hsu | ................. | H01L 21/823418 |
| 2022/0102192 A1* | 3/2022 | Su | .................... | H01L 21/76895 |
| 2022/0293458 A1* | 9/2022 | Khaderbad | ..... | H01L 21/823481 |

\* cited by examiner

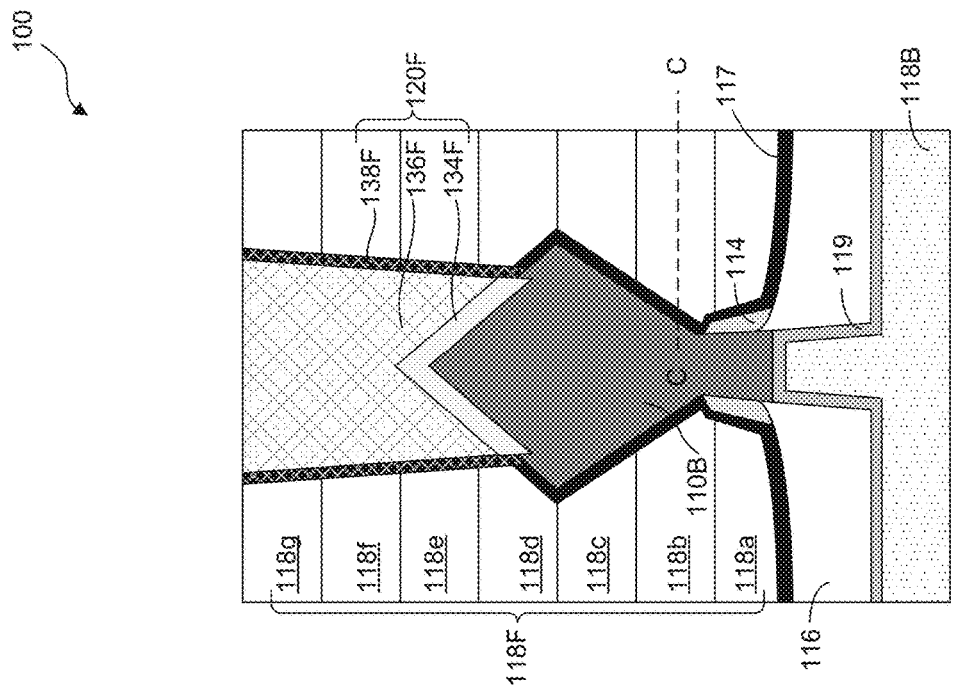
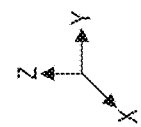
Fig. 1C
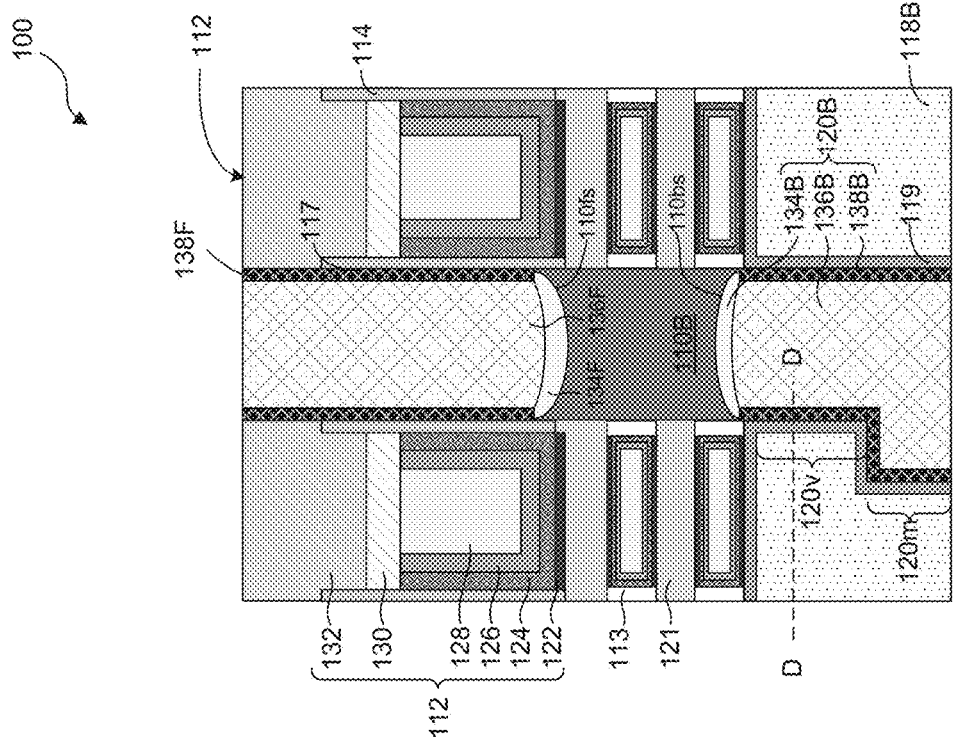
FIG. 1B

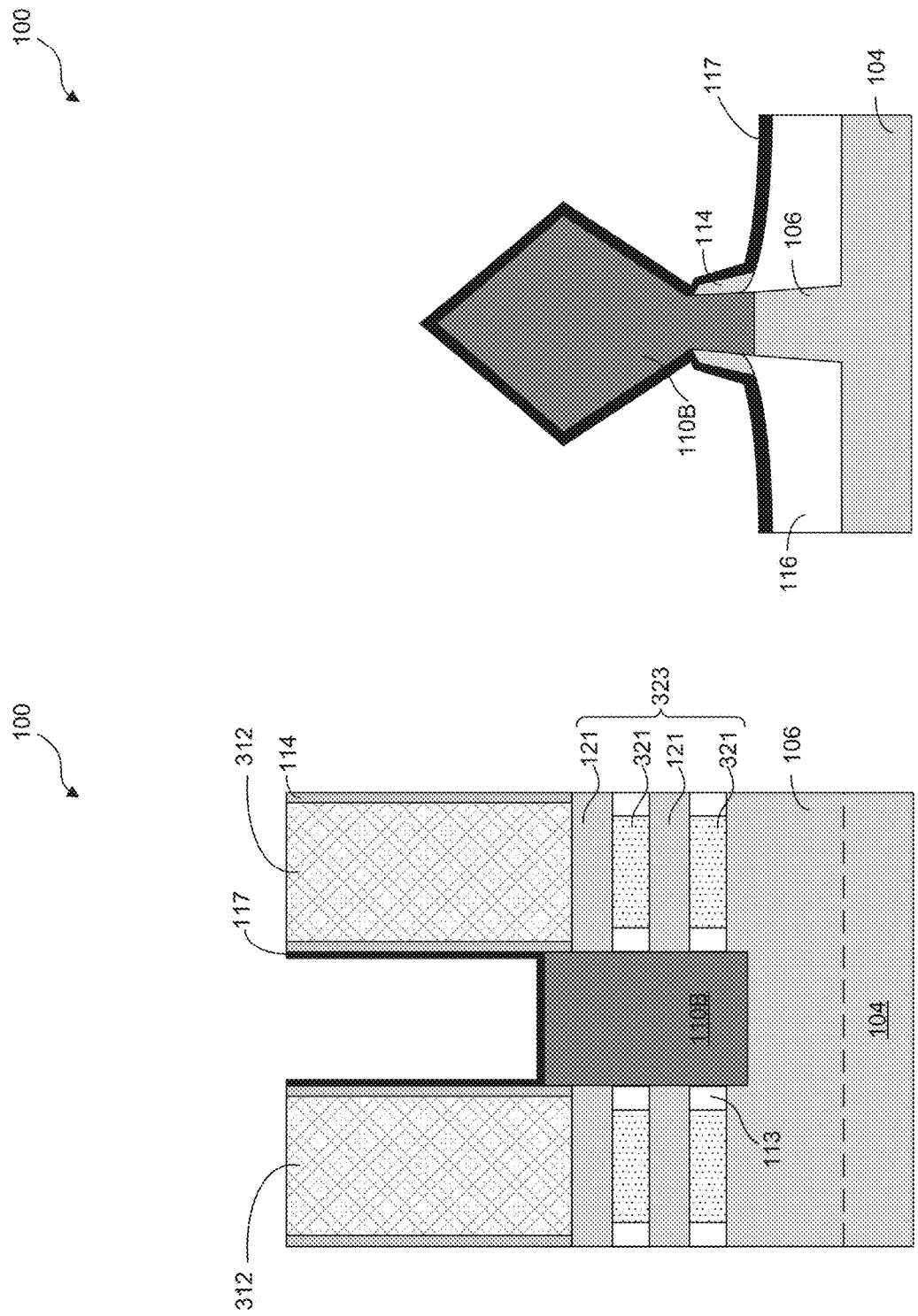

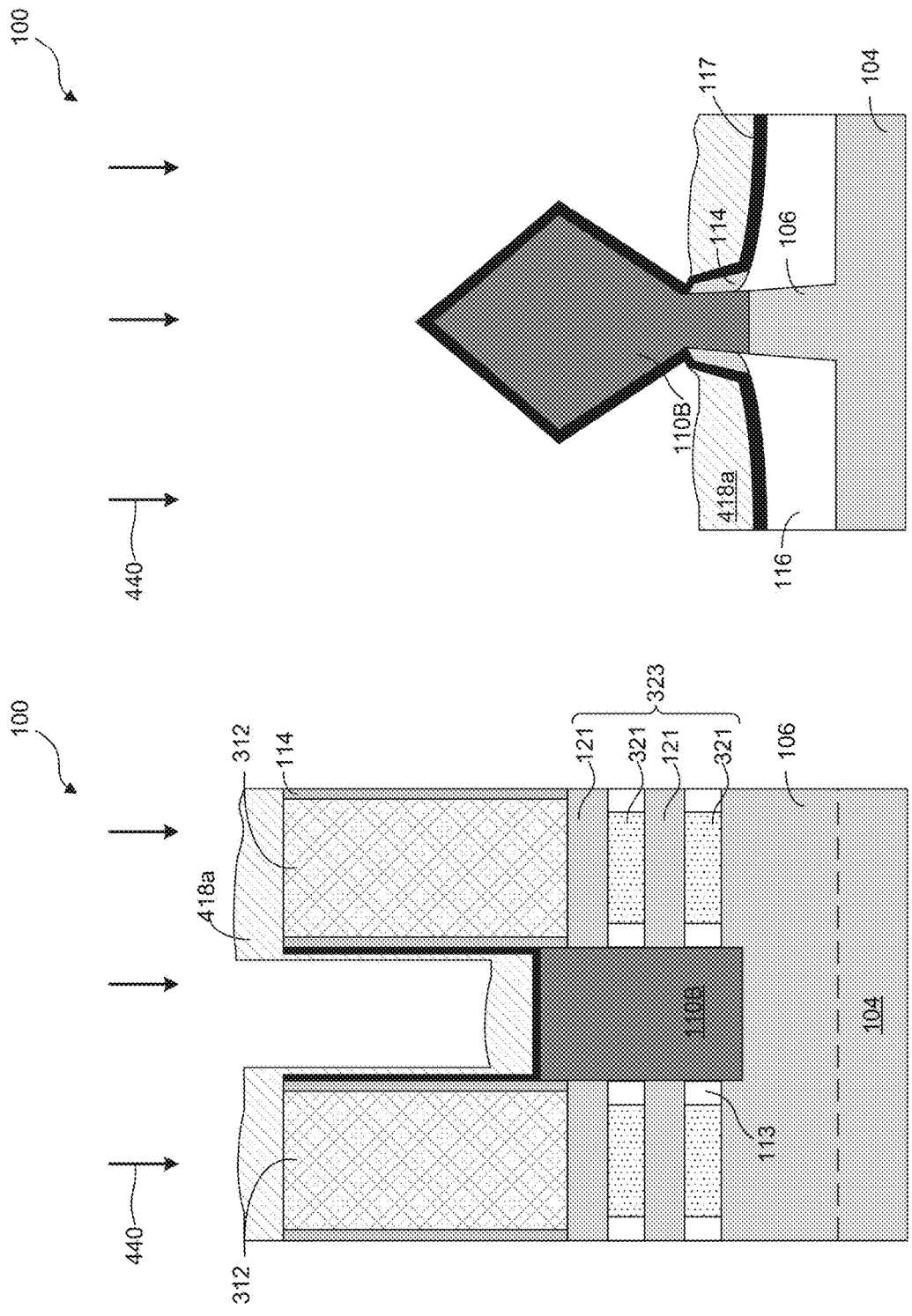

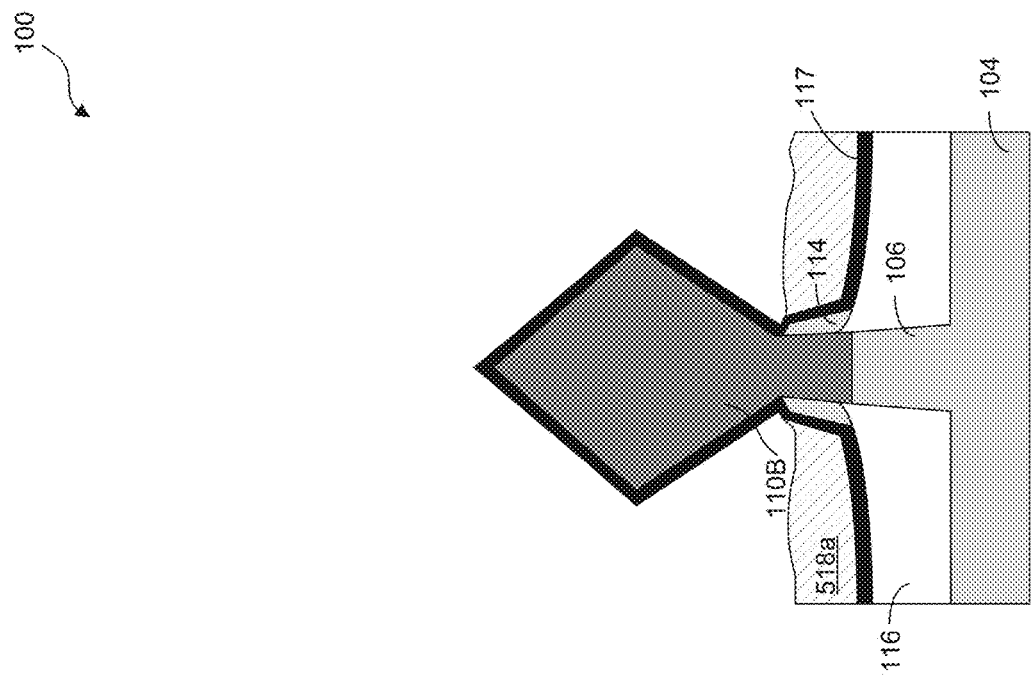
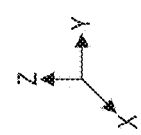
Fig. 5B
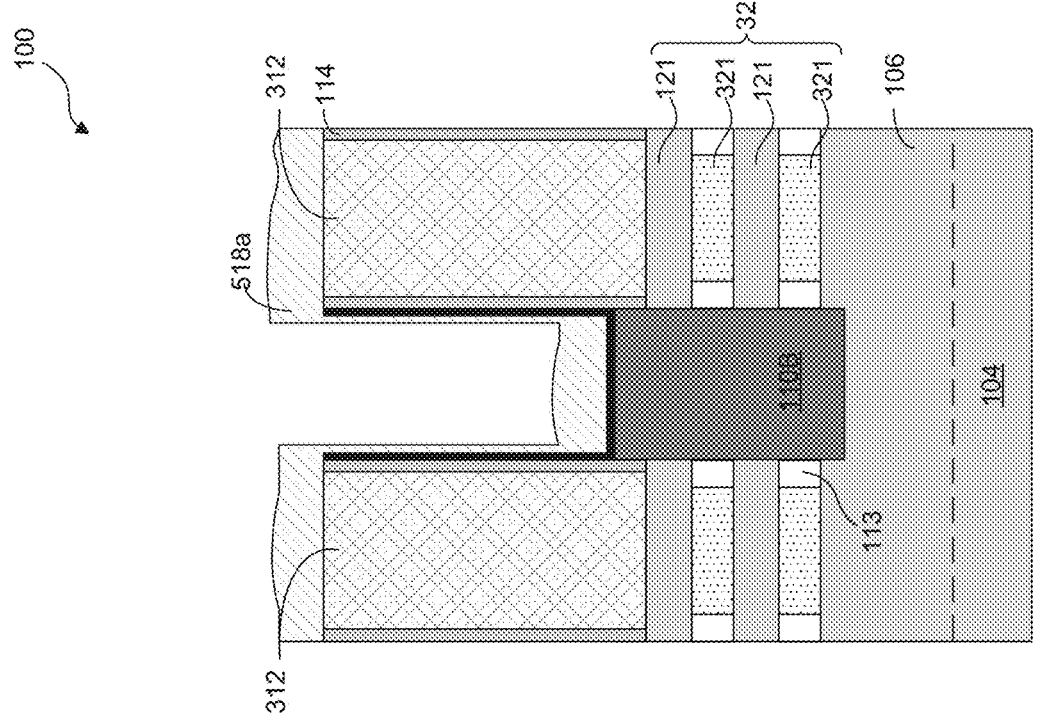
Fig. 5A

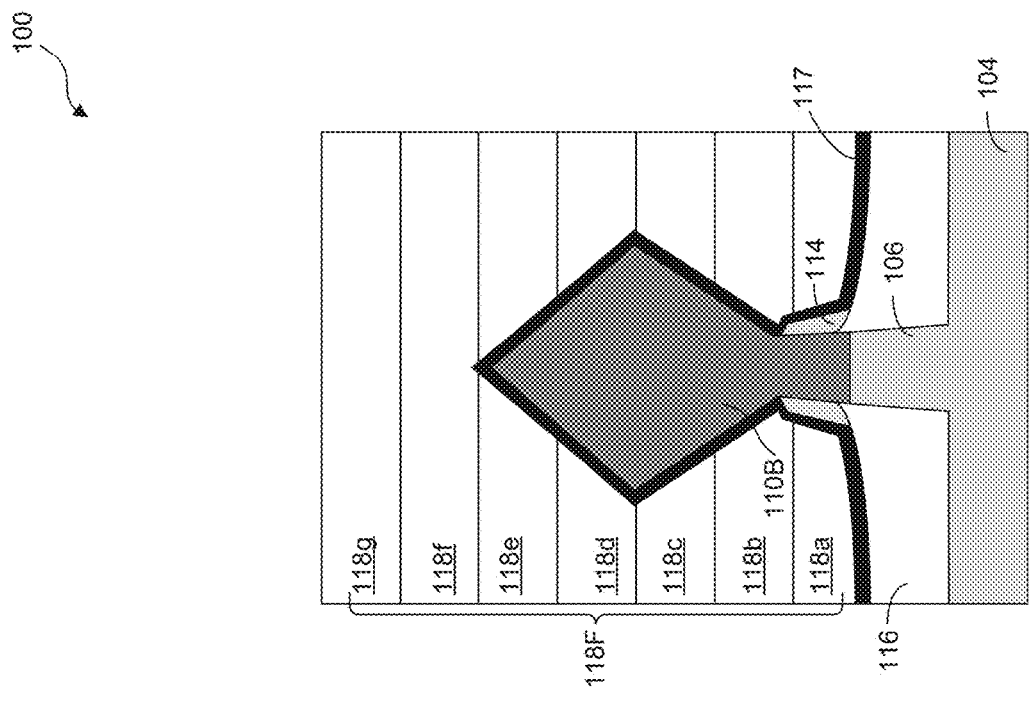
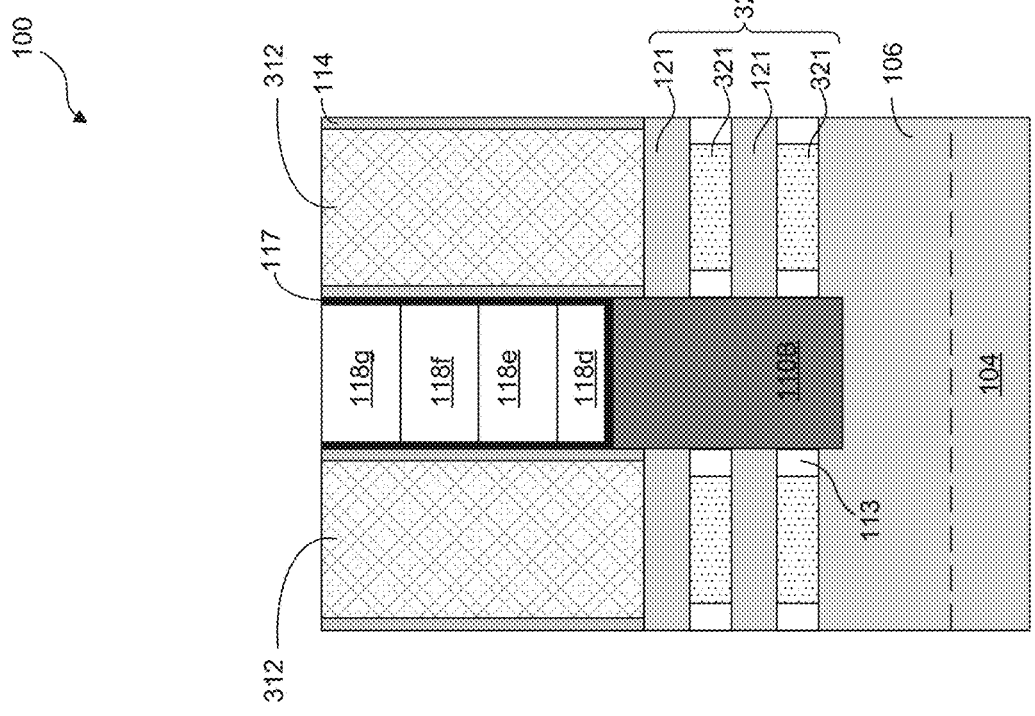
Fig. 8A
Fig. 8B

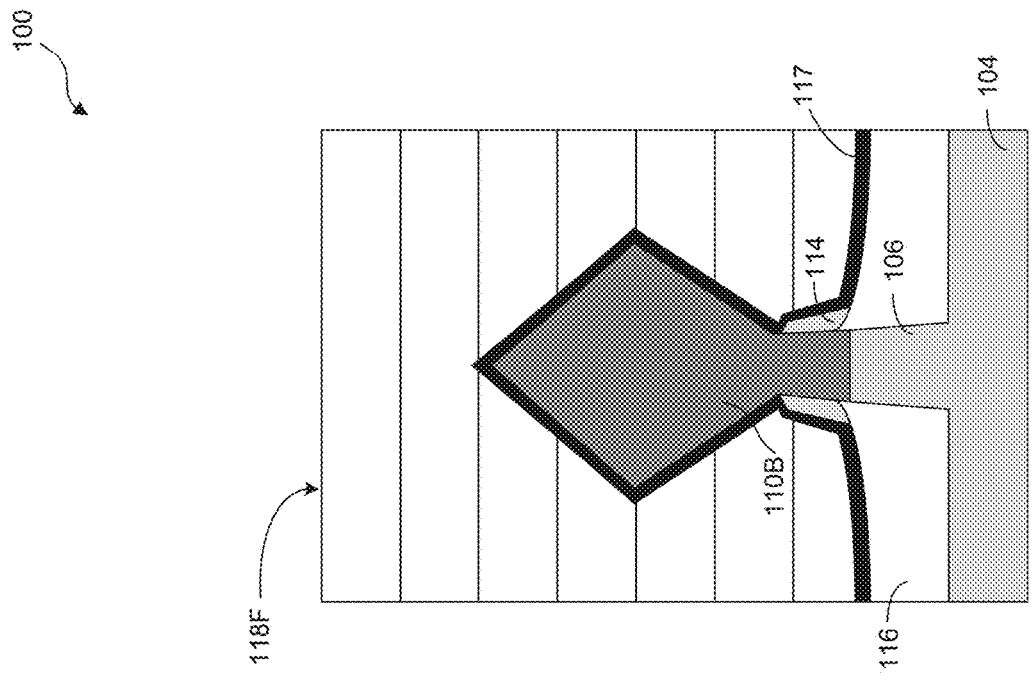
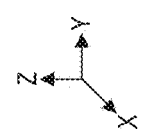
Fig. 10B
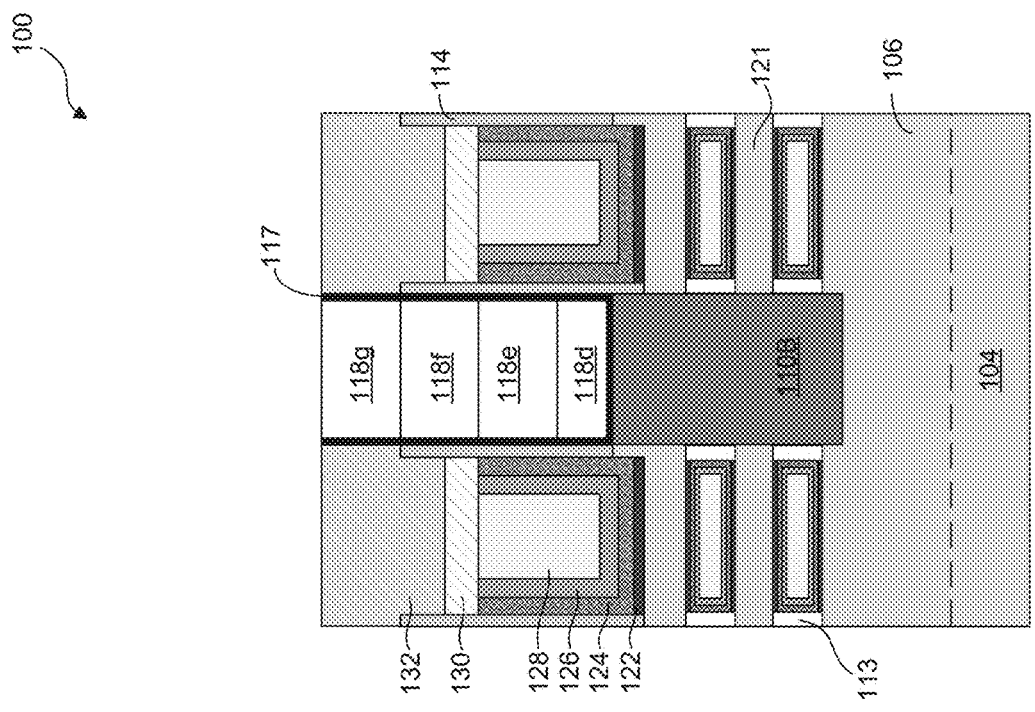
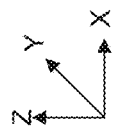
Fig. 10A

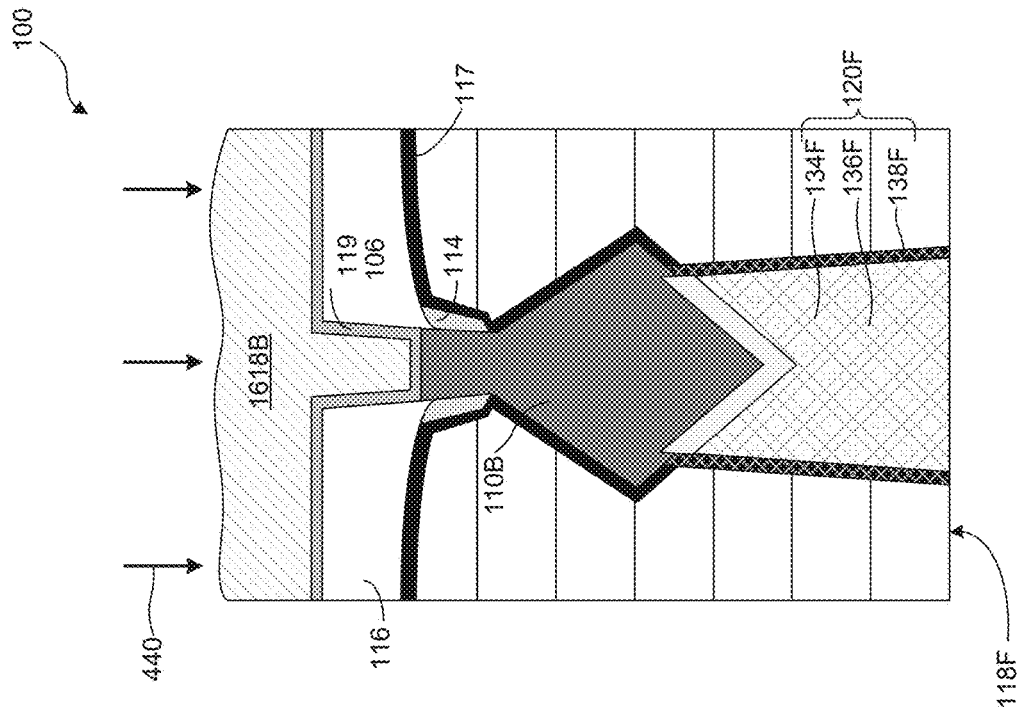
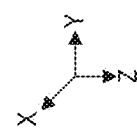
Fig. 16B
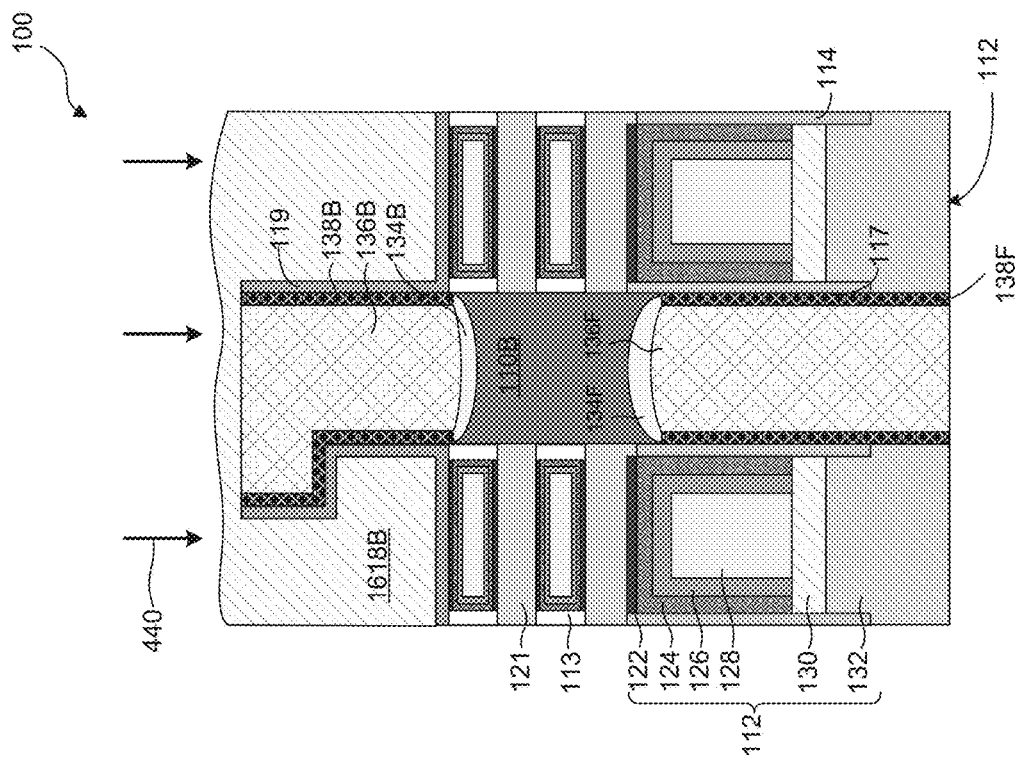
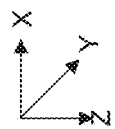
Fig. 16A

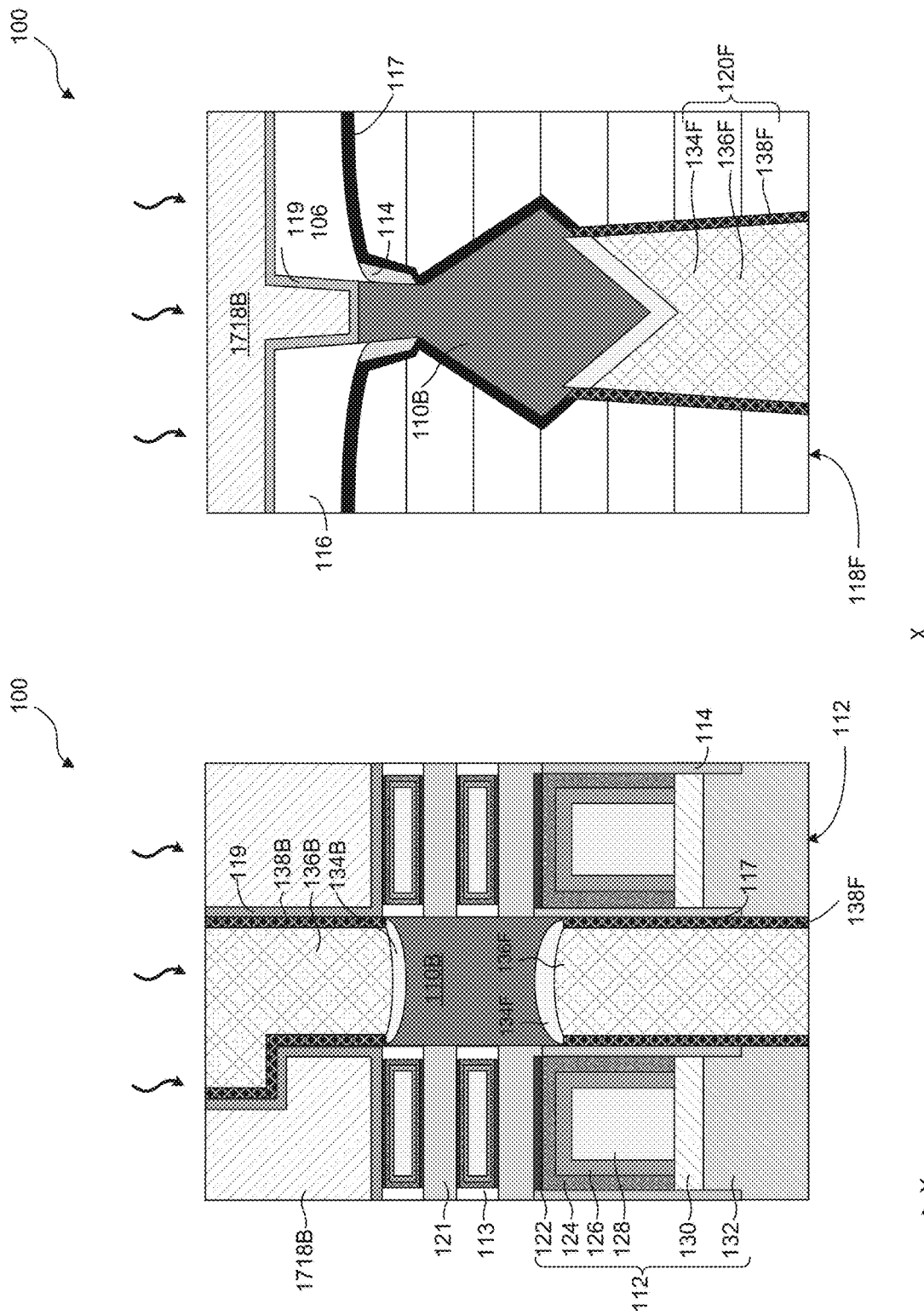

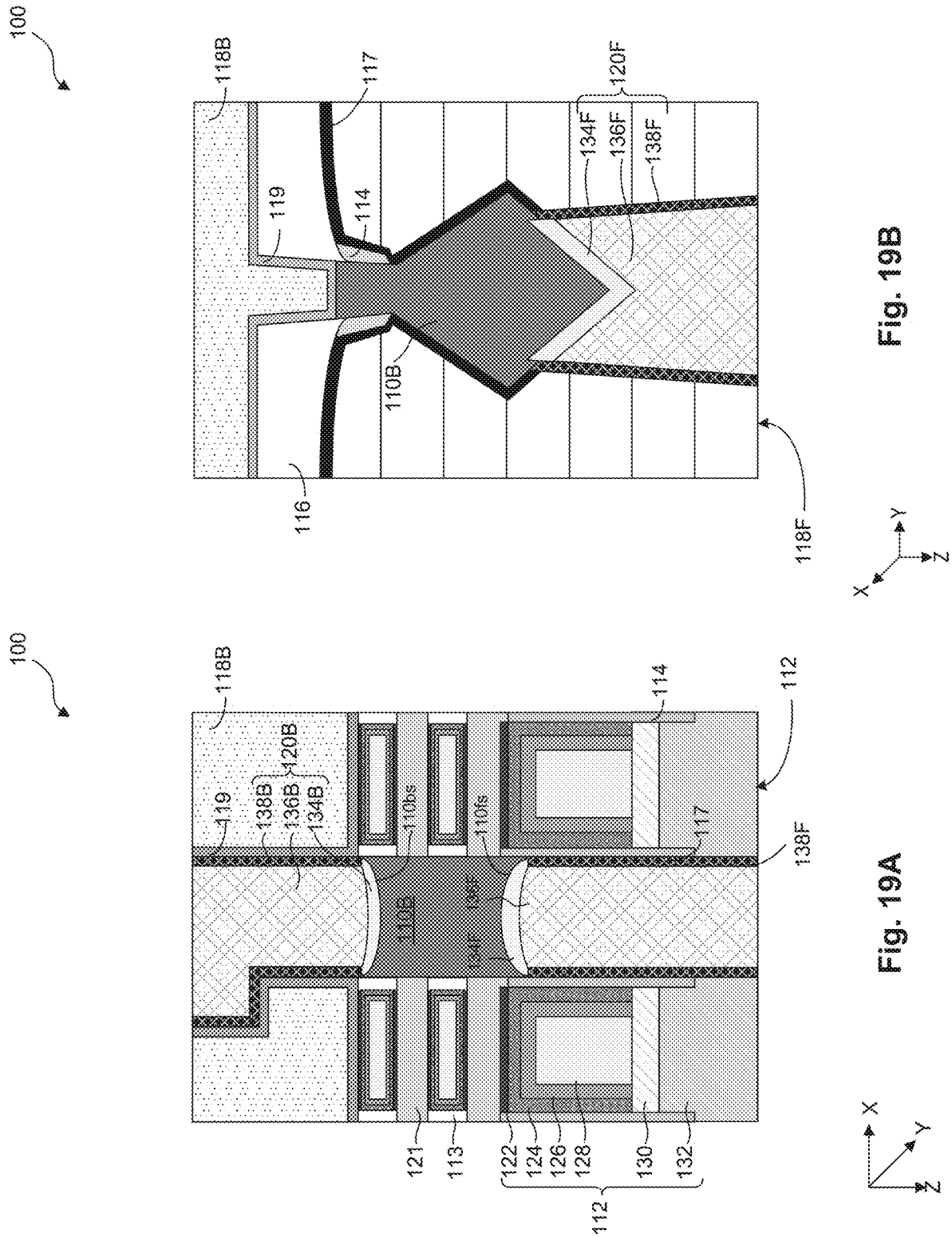

DIELECTRIC STRUCTURES IN SEMICONDUCTOR DEVICES

CROSS-REFERENCE TO RELATED APPLICATIONS

This application claims the benefit of U.S. Provisional Patent Application No. 63/219,956, titled "Flowable Dielectric Material for Horizontal Structure Gap-fill," filed Jul. 9, 2021, and U.S. Provisional Patent Application No. 63/555, 785, titled "Flowable Dielectric Material for Gap-fill," filed Jul. 16, 2021, each of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIG. 1B-1C illustrate cross-sectional views of a semiconductor device with dielectric structures, in accordance with some embodiments.

FIGS. 3A-19B illustrate cross-sectional views of a semiconductor device with dielectric structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
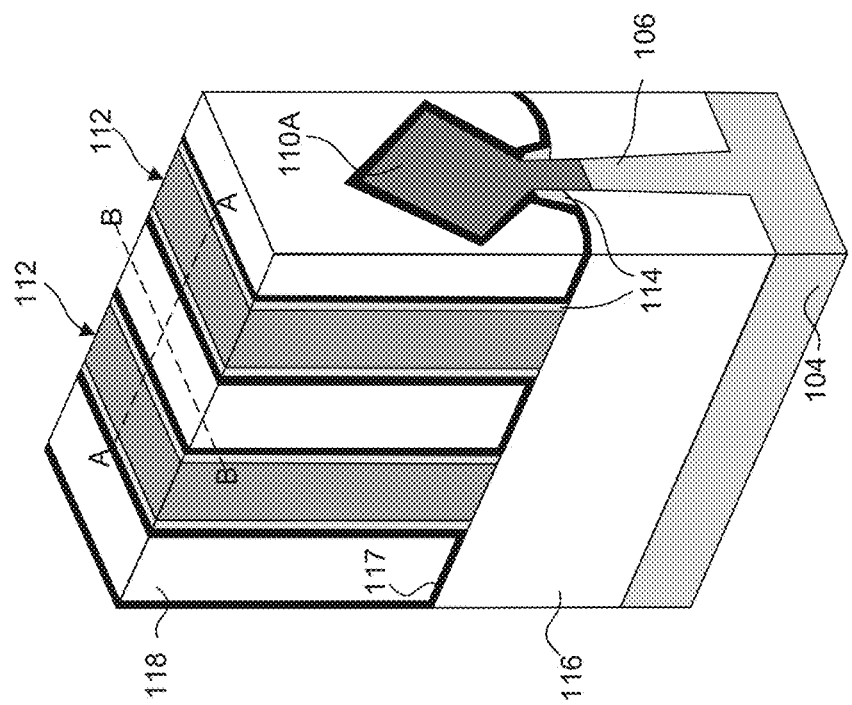
FIG. 1A illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example structures of FETs (e.g., finFETs or GAA FETs) with densified dielectric structures configured to provide electrical isolation between adjacent structures, and example methods of forming the same substrate. In some embodiments, the densified dielectric structures can be formed on front-side and back-side surfaces of the FET. In some embodiments, the densified dielectric structures can be formed on front-side surfaces of source/drain (S/D) regions and on back-side surfaces of gate structures. The example methods form the densified dielectric structures with substantially uniform density across the heights and widths of the densified dielectric structures. In some embodiments, the methods can form portions of the densified dielectric structures within gaps between adjacent structures (e.g., gaps between diamond-shaped S/D regions and shallow trench isolation (STI) regions) substantially uniform with other portions of the densified dielectric structures.

FIG. 1A illustrates an isometric view of a FET 100, according to some embodiments. FIG. 1B illustrates a cross-sectional view of FET 100, along line A-A of FIG. 1A, and FIG. 1C illustrates a cross-sectional view of FET 100, along line B-B of FIG. 1A. FIGS. 1B and 1C illustrate cross-sectional views of FET 100 with additional structures that are not shown in FIG. 1A for simplicity. The discussion of elements with the same annotations applies to each other, unless mentioned otherwise. In some embodiments, FET 100 can represent n-type FET 100 (NFET 100) or p-type FET 100 (PFET 100) and the discussion of FET 100 applies to both NFET 100 and PFET 100, unless mentioned otherwise.

Referring to FIGS. 1A-1C, FET 100 can include an array of gate structures 112 disposed on a fin structure 106, stacks of nanostructured channel regions 121 surrounded by gate structures 112, an array of S/D regions 110A-110B (S/D region 110A visible in FIG. 1A and S/D region 110B visible in FIGS. 1B-1C) disposed on portions of fin structure 106 that are not covered by gate structures 112, a front-side contact structure 120F disposed on a front-side surface 110fs of S/D region 110B, and a back-side contact structure 120B disposed on a back-side surface 110bs of S/D region 110B. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm.

FET 100 can further include gate spacers 114, shallow trench isolation (STI) regions 116, etch stop layers (ESLs) 117, a densified interlayer dielectric (ILD) layer 118F (also referred to as "front-side densified ILD layer 118F") disposed on a front-side surface of FET 100, a densified ILD layer 118B (also referred to as "back-side densified ILD layer 118B") disposed on a back-side surface of FET 100, and a back-side barrier layer 119. The stack of densified ILD layers 118F can be disposed on ESL 117 and densified ILD layer 118B can be disposed on back-side barrier layer 119. ESL 117 can be configured to protect gate structures 112 and/or S/D regions 110 and back-side barrier layer 119 can be configured to protect gate structures 112 during subsequent processing. In some embodiments, gate spacers 114, STI regions 116, ESL 117, densified ILD layer 118F, densified ILD layer 118B, and back-side barrier layer 119 can include an insulating material.

FET 100 can be formed on a substrate 104. There may be other FETs and/or structures (e.g., isolation structures) formed on substrate 104. Substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). In some embodiments, fin structure 106 can include a material similar to substrate 104 and extend along an X-axis.

In some embodiments, for NFET 100, each of S/D regions 110A-110B can include an epitaxially-grown semiconductor material, such as Si, and n-type dopants, such as phosphorus and other suitable n-type dopants. In some embodiments, for PFET 100, each of S/D regions 110A-110B can include an epitaxially-grown semiconductor material, such as Si and SiGe, and p-type dopants, such as boron and other suitable p-type dopants.

In some embodiments, front-side contact structure 120F can include a silicide layer 134F disposed on front-side surface 110fs, a contact plug 136F disposed on silicide layer 134F, and a nitride barrier layer 138F along sidewalls of contact plug 136. In some embodiments, silicide layer 134F can include titanium silicide ($Ti_xSi_y$), tantalum silicide ($Ta_xSi$), molybdenum silicide ($Mo_xSi_y$), nickel silicide ($Ni_xSi_y$), cobalt silicide ($Co_xSi_y$), tungsten silicide ($W_xSi_y$), or a combination thereof. In some embodiments, contact plug 136F can include conductive materials, such as cobalt (Co), tungsten (W), ruthenium (Ru), iridium (Ir), nickel (Ni), osmium (Os), rhodium (Rh), aluminum (Al), molybdenum (Mo), copper (Cu), zirconium (Zr), stannum (Sn), silver (Ag), gold (Au), zinc (Zn), cadmium (Cd), and a combination thereof. In some embodiments, front-side contact structure 120F can electrically connect to overlying interconnect structures (not shown), power supplies (not shown), and/or other elements of FET 100 and/or IC and provide electrical conduction to S/D region 110B through front-side surface 110fs.

Referring to FIG. 1B, in some embodiments, back-side contact structure 120B can include a silicide layer 134B disposed on back-side surface 110bs, a contact plug 136B disposed on silicide layer 134B, and a nitride barrier layer 138B along sidewalls of contact plug 136B. In some embodiments, back-side contact structure 120B can include a via 120v and a metal line 120m. In some embodiments, back-side contact structure 120B can electrically to a back power rail (not shown) and/or other elements of FET 100 and/or IC and provide electrical conduction to S/D region 110B through back-side surface 110bs. The discussion of silicide layer 134F applies to silicide layer 134B, unless mentioned otherwise. In some embodiments, silicide layers 134F and 134B can have the same material or different material from each other. The discussion of contact plug 136F applies to contact plug 136B, unless mentioned otherwise. In some embodiments, contact plugs 136F and 136B can have the same material or different material from each other. In some embodiments, back-side contact structure 120B can electrically connect to interconnect structures (not shown), power supplies (not shown), and/or other elements of FET 100 and/or IC and provide electrical conduction to S/D region 110B through back-side surface 110bs.

Referring to FIG. 1C, in some embodiments, densified ILD layer 118F can include a stack of densified dielectric layers 118a-118g disposed on S/D regions 110A-11B (not shown on S/D region 110A for simplicity) and ESL 117. In some embodiments, each of densified dielectric layers 118a-118g can have a thickness of about 4 nm to about 10 nm. Densified ILD layer 118F can be formed with densified dielectric layers 118a-118g instead of a single densified dielectric layer to achieve substantially uniform material density across the height and width of ILD layer 118F. In some embodiments, as described below, the method of forming densified ILD layer 118F with densified dielectric layers 118a-118g can make the material density of the portions of ILD layer 118F within gaps between adjacent structures (e.g., gaps between diamond-shaped S/D region 110B and STI regions 116 shown in FIG. 1C) substantially uniform with other portions of ILD layer 118F.

In some embodiments, when the gaps have a height greater than about 10 nm and a width greater than about 5 nm, such as gaps between diamond-shaped S/D region 110B and STI regions 116, densified ILD layer 118F formed with dielectric layers 118a-118g can more adequately form substantially uniform material density across line C-C (FIG. 1C) than densified ILD layer 118F formed with a single dielectric layer. In some embodiments, when the gaps between adjacent structures (e.g., gaps between metal line 120m and gate structure 112 shown in FIG. 1B) have a height smaller than about 10 nm and a width smaller than about 5 nm, densified ILD layer 118B can be formed with a single dielectric layer and achieve substantially uniform material density across line D-D (FIG. 1B), as described in detail below.

In some embodiments, each of densified ILD layers 118a-118g can include the same dielectric material with substantially the same chemical composition (e.g., substantially the same atomic concentration profiles). In some embodiments, two or more of densified ILD layers 118a-118g can include the same dielectric material or a dielectric material different from each. In some embodiments, two or more of densified ILD layers 118a-118g can include the same dielectric material with concentration profiles different from each other. In some embodiments, each of densified ILD layers 118a-118g can have concentration profiles with peak atomic concentrations in the bulk of each densified ILD layers 118a-118g, and the smallest atomic concentrations at the interfaces between densified ILD layers 118a-118g.

In some embodiments, each of densified ILD layers 118a-118g can include doped silicon carbide, such as oxygen doped silicon carbide (SiOC), and nitrogen and oxygen doped silicon carbide (SiOCN). In some embodiments, each of densified ILD layers 118a-118g can have carbon and oxygen concentration profiles with peak carbon and oxygen concentrations in the bulk of each densified ILD layers 118a-118g, and the smallest carbon and oxygen concentrations at the interfaces between densified ILD layers 118a-118g. In some embodiments, each of densified ILD layers 118a-118g can include SiOCN with a carbon concentration of about 30 atomic % to about atomic 50%, a silicon concentration of about 20 atomic % to about 30 atomic %, an oxygen concentration of about 25 atomic % to about 40 atomic %, and a nitrogen concentration of about 1 atomic % to about atomic % to exhibit a carbide-to-oxide etch selectivity of about 40 to about 70, and a density of about 2.1 gm/cm$^3$ to about 4 gm/cm$^3$. The high etch selectivity and high density can protect structures during device processing and electrically isolate adjacent structures more adequately than oxide ILD layers (e.g., silicon oxide (SiO$_2$) ILD layers). In some embodiments, each of densified ILD layers 118a-118g can include a combination of silicon-carbon (Si—C) and silicon-oxygen (Si—O) bonds. The Si—C bonds can provide each of densified ILD layers 118a-118g with a greater chemical stability, thermal stability, resistance to etching, and etch selectivity over oxide compared to oxide ILD layers.

Referring to FIGS. 1B-1C, in some embodiments, back-side barrier layer 119 can include a nitride layer and can protect gate structures 112 and S/D regions 110A-110B during the formation of back-side contact structure 120B and other back-side structures (not shown). In some embodiments, densified ILD layer 118B can be disposed on back-side barrier layer 119. Densified ILD layer 118B can provide electrical isolation between back-side contact structure 120B and other back-side contact structures (not shown). The discussion of the materials and properties of densified ILD layer 118F applies to densified ILD layer 118B, unless mentioned otherwise. In some embodiments, densified ILD layers 118F and 118B can have the same material or different material from each other.

Referring to FIG. 1B, in some embodiments, nanostructured channel regions 121 can include semiconductor materials similar to or different from substrate 104. In some embodiments, nanostructured channel regions 121 can include Si, SiAs, silicon phosphide (SiP), SiC, SiCP, SiGe, silicon germanium boron (SiGeB), germanium boron (GeB), silicon germanium stannum boron (SiGeSnB), a III-V semiconductor compound, or other suitable semiconductor materials. Though rectangular cross-sections of nanostructured channel regions 121 are shown, nanostructured channel regions 121 can have cross-sections of other geometric shapes (e.g., circular, elliptical, triangular, or polygonal).

In some embodiments, gate structures 112 can be multilayered structures and can surround each of nanostructured channel regions 121 for which gate structures 112 can be referred to as "gate-all-around (GAA) structures" or "horizontal gate-all-around (HGAA) structures." NFET 100 can be referred to as "GAA FET 100" or "GAA NFET 100" and PFET 100 can be referred to as "GAA FET 100" or "GAA PFET 100." The portions of gate structures 112 surrounding nanostructured channel regions 121 can be electrically isolated from adjacent S/D region 110B by inner spacers 113. Inner spacers 113 can include a material similar to gate spacers 114. In some embodiments, FET 100 can be a finFET and have fin regions (not shown) instead of nanostructured channel regions 121.

In some embodiments, gate structures 112 can include interfacial oxide (10) layers 122, high-k (HK) gate dielectric layers 124 disposed on IO layers 122, work function metal (WFM) layers 126 disposed on HK gate dielectric layers 124, gate metal fill layers 128 disposed on WFM layers 126, conductive capping layers 130 disposed on HK gate dielectric layers 124, WFM layers 126, and gate metal fill layers 128, and insulating capping layers 132 disposed on conductive capping layers 130.

In some embodiments, IO layers 122 can include silicon oxide (SiO$_2$), silicon germanium oxide (SiGeO$_x$), or germanium oxide (GeO$_x$) and can have a thickness of about 0.5 nm to about 2 nm. In some embodiments, HK gate dielectric layers 124 can include a high-k dielectric material, such as hafnium oxide (HfO$_2$), titanium oxide (TiO$_2$), hafnium zirconium oxide (HfZrO), tantalum oxide (Ta$_2$O$_3$), hafnium silicate (HfSiO$_4$), zirconium oxide (ZrO$_2$), and zirconium silicate (ZrSiO$_2$) can have a thickness of about 0.5 nm to about 4 nm. Within these thickness ranges of IO layers 122 and HK gate dielectric layers 124, adequate electrical isolation between gate structures 112 and nanostructures channel regions 121 can be provided without compromising device size and manufacturing cost.

In some embodiments, WFM layers 126 of NFET gate structures 112 can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based materials., or a combination thereof. In some embodiments, WFM layers 126 of PFET gate structures 112 can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), and a combination thereof. In some embodiments, gate metal fill layers 128 can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

Insulating capping layers 132 protects the underlying conductive capping layers 130 from structural and/or compositional degradation during subsequent processing of the semiconductor device. In some embodiments, insulating capping layer 132 can include a nitride material, such as silicon nitride, and can have a thickness of about 5 nm to about 10 nm for adequate protection of the underlying conductive capping layer 130. Conductive capping layers 130 provide conductive interfaces between gate metal fill layers 128 and gate contact structures (not shown) to electrically connect gate metal fill layers 128 to gate contact structures without forming gate contact structures directly on or within gate metal fill layers 128. In some embodiments, conductive capping layer 130 can include a metallic material, such as W, Ru, Ir, Mo, other suitable metallic materials, and a combination thereof.

Figure 2A:
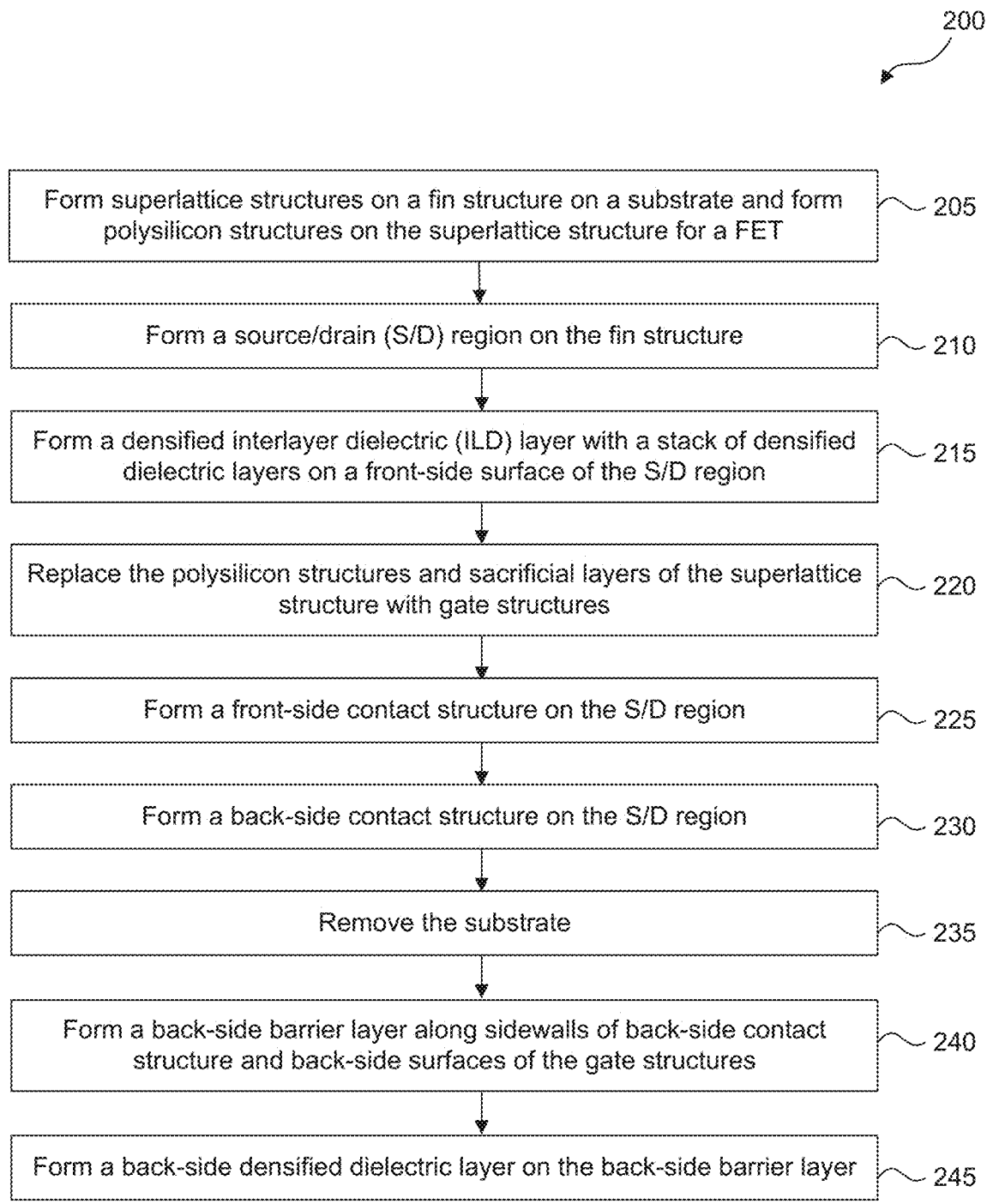
FIGS. 2A-2C are flow diagrams of a method for fabricating a semiconductor device with dielectric structures, in accordance with some embodiments.
Figure 2B:
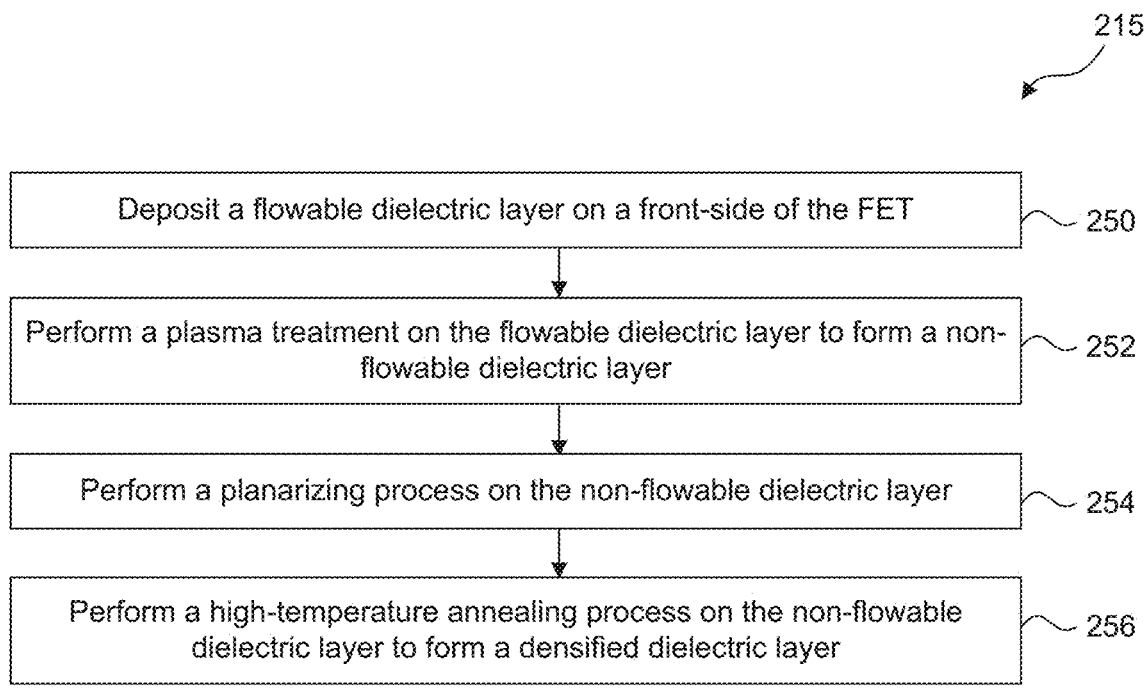
Figure 2C:
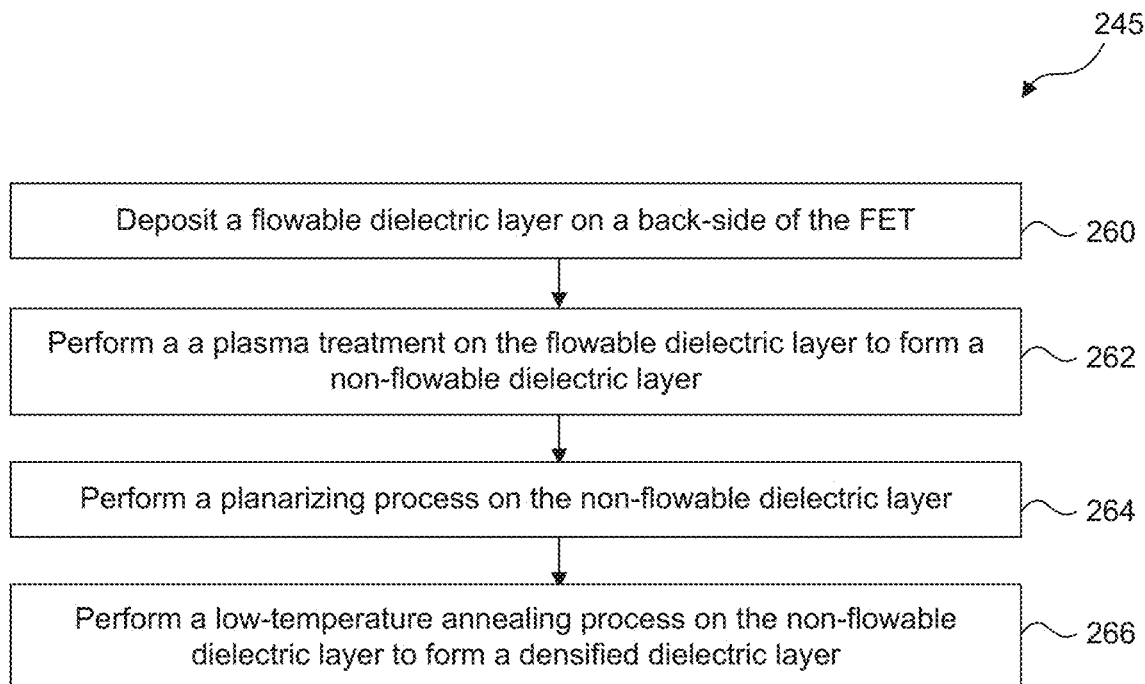

FIG. 2A is a flow diagram of an example method 200 for fabricating FET 100, according to some embodiments FIG. 2B is a flow diagram of operation 215 of example method 200 for fabricating densified ILD layer 118F, as shown in FIG. 1C, according to some embodiments. FIG. 2C is a flow diagram of operation 245 of example method 200 for fabricating for fabricating densified ILD layer 118B, as shown in FIGS. 1B-1C, according to some embodiments. For illustrative purposes, the operations illustrated in FIGS. 2A-2C will be described with reference to FIGS. 3A-19B. FIGS. 3A-19A are cross-sectional views of FET 100 along line A-A of FIG. 1A and FIGS. 3B-19B are cross-sectional views of FET 100 along line B-B of FIG. 1A at various stages of fabrication, according to some embodiments. Operations can be performed in a different order or not performed depending on specific applications. It should be noted that method 200 may not produce a complete FET 100. Accordingly, it is understood that additional processes can be provided before, during, and after method 200, and that some other processes may only be briefly described herein. Elements in FIGS. 3A-19B with the same annotations as elements in FIGS. 1A-1C are described above.

Referring to FIG. 2A, in operation 205, superlattice structures are formed on a fin structure on a substrate, and polysilicon structures are formed on the superlattice structures for a FET. For example, as shown in FIG. 3A, superlattice structures 323 are formed on fin structure 106, and polysilicon structures 312 are formed on superlattice structures 323. Superlattice structures 323 can include nanostructured layers 121 and 321 arranged in an alternating configuration. In some embodiments, nanostructured layers 121 and 321 include materials different from each other. Nanostructured layers 321 are also referred to as sacrificial layers 321. During subsequent processing, polysilicon structures 312 and sacrificial layers 321 can be replaced in a gate replacement process to form gate structures 112.

Referring to FIG. 2A, in operation 210, a S/D regions is formed on the fin structure. For example as shown in FIGS. 3A-3B, S/D region 110B is formed on fin structure 106. In some embodiments, D region 110B can be epitaxially grown on fin structure 106. Prior to the formation of S/D regions 110N-110P, inner spacers 113 can be formed in superlattice structures 323, as shown in FIG. 3A. After the formation of S/D region 110B, ESL 117 can be formed, as shown in FIGS. 3A-3B.

Referring to FIG. 2A, in operation 215, a densified ILD layer with a stack of densified dielectric layers is formed on the S/D region. For example, as described with reference to FIGS. 2B and 4A-8B, densified ILD layer 118F is formed on S/D region 110B and ESL 117. Referring to FIG. 2B, in some embodiments, operation 215 can include operations 250-256 for the formation of densified ILD layer 118F.

Referring to FIG. 2B, in operation 250, a flowable dielectric layer is deposited on a front-side of the FET. For example, as shown in FIGS. 4A-4B, a flowable dielectric layer 418a with a thickness of about 4 nm to about 12 nm is deposited. The deposition of flowable dielectric layer 418a includes sequential operations of (i) flowing a precursor of a flowable dielectric material on the structures of FIGS. 3A-3B using a flowable chemical vapor deposition (FCVD) process, (ii) flowing source gases of ammonia ($NH_3$; or nitrogen) and oxygen into a remote plasma source chamber (not shown), (iii) flowing an inert gas with the source gases of ammonia and oxygen, (iv) generating radicals of ammonia (or nitrogen) and oxygen atoms from the source gases in the remote plasma source chamber, and (iv) flowing the radicals of ammonia (or nitrogen) and oxygen atoms into the deposition process chamber (not shown) and on the structures of FIGS. 3A-3B to form the structures of FIGS. 4A-4B. In some embodiments, the gas flow rate ratio of the precursor to the source gas of ammonia ($NH_3$; or nitrogen) is about 1:1 to about 1:2 and the gas flow rate ratio of the precursor gas to the source gas of oxygen is about 1:1 to about 1:2.

In some embodiments, the precursor can include silicon-containing precursor with silicon-hydrogen (Si—H) and silicon-nitrogen (Si—N) bonds, such as Trisilylamine (TSA) and other suitable silicon-containing precursor. In some embodiments, the precursor can include a silicon-, oxygen-, hydrogen-, and carbon-containing precursor with (i) one or more Si—C—Si bonds, Si—O bonds, and silicon-methyl group (Si—$CH_3$) bonds, or (ii) one or more Si—O—Si bonds, Si—H bonds, and Si—$CH_3$ bonds. In some embodiments, the precursor can be a linear siloxane, such as pentamethyldisiloxane (PMDSO), tetramethyldisiloxane (TMDSO), hexamethyltrisiloxane, and heptamethyltrisiloxane. In some embodiments, the precursor can include a silicon- and carbon-containing precursor with carbon-carbon double bonds (C=C). In some embodiments, the radicals of ammonia (or nitrogen) and oxygen atoms can substantially decrease the hydrogen atoms and increase the bond density of Si—N and/or Si—O bonds in flowable dielectric layer 418a.

Referring to FIG. 2B, in operation 252, a plasma treatment is performed on the flowable dielectric layer to form a non-flowable dielectric layer. For example, as shown in FIGS. 5A-5B, a non-flowable dielectric layer 518a is formed after a plasma treatment. The formation of non-flowable dielectric layer 518a includes sequential operations of (i) flowing helium, hydrogen, argon, or nitrogen gas into an inductively coupled plasma (ICP) chamber (not shown), (ii) generating plasma 440 of helium, hydrogen, argon, or nitrogen in the ICP chamber, and (iii) flowing plasma 440 of helium, hydrogen, argon, or nitrogen on the structures of FIGS. 4A-4B to form the structures of FIGS. 5A-5B. In some embodiments, a UV and ozone treatment can be performed, instead of the plasma treatment, on the structures of FIGS. 4A-4B to form the structures of FIGS. 5A-5B.

In some embodiments, the plasma treatment can remove hydrogen and nitrogen atoms from flowable dielectric layer 418a and promote cross-linking to form additional Si—O bonds, while substantially preserving the existing Si—C and Si—O bonds in flowable dielectric layer 418a. As a result, non-flowable dielectric layer 518a formed after the plasma treatment can have (i) a higher bond density of S—O bonds, (ii) a lower bond density of Si—N and Si—H bonds, (iii) a reduced flowable material property, and (iv) a higher material density than flowable dielectric layer 418a. The higher material density and the reduced flowable material property of non-flowable dielectric layer 518a can provide better etch control in subsequent operation 254 than flowable dielectric layer 418a.

Figures 6A, 6B:
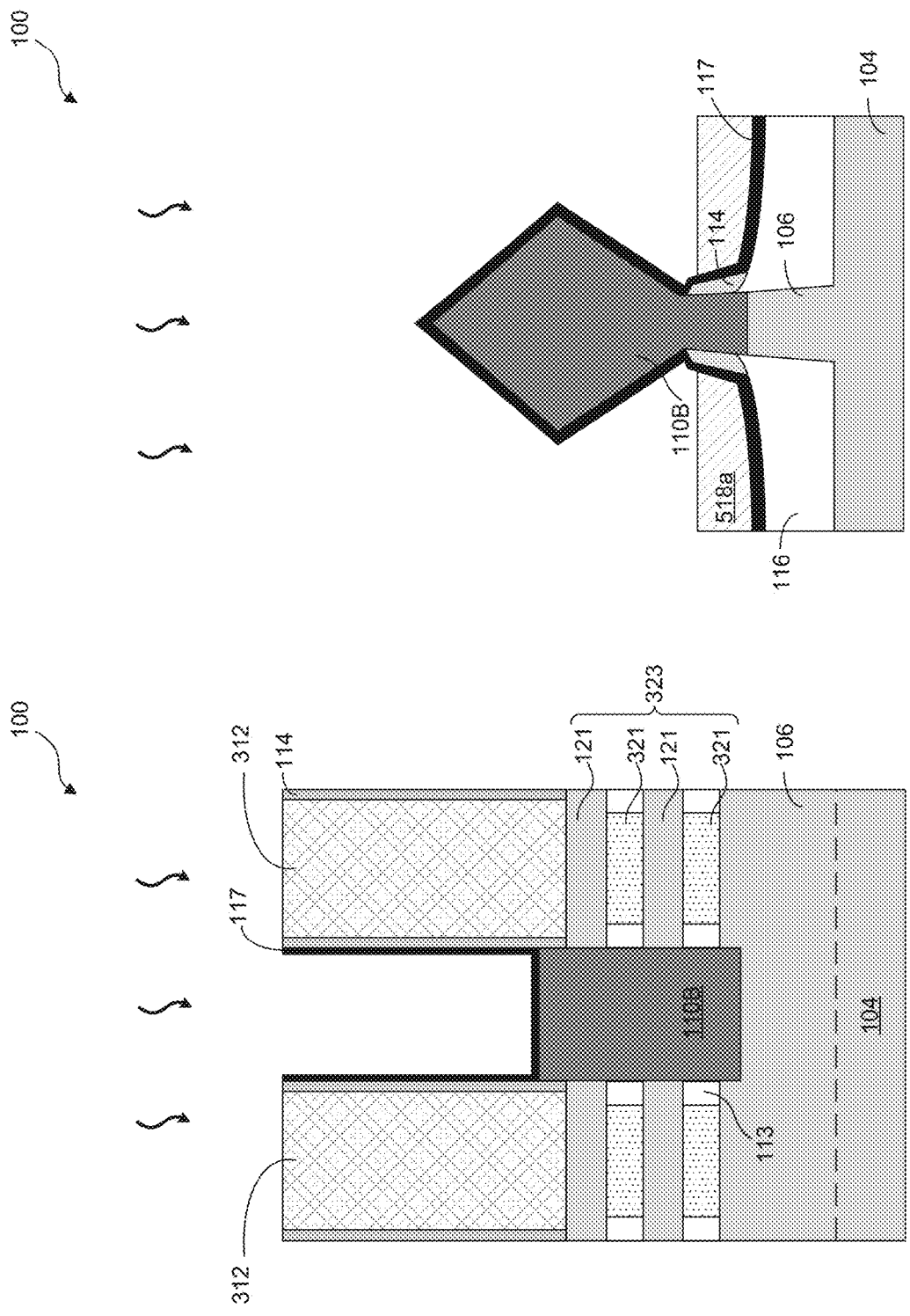

Referring to FIG. 2B, in operation 254, a planarization process is performed on the non-flowable dielectric layer. For example, as shown in FIG. 6B, a top surface of non-flowable dielectric layer 518a is substantially planarized. The planarization process can include performing a wet etching process using a wet etchant, such as dilute hydrofluoric acid (DHF) on the structures of FIGS. 5A-5B. In some embodiments, besides planarizing the top surface of non-flowable dielectric layer 518a, the wet etching process can remove portions of non-flowable dielectric layer 518a from top surfaces of polysilicon structures 312, as shown in FIG. 6A.

Figure 7B:
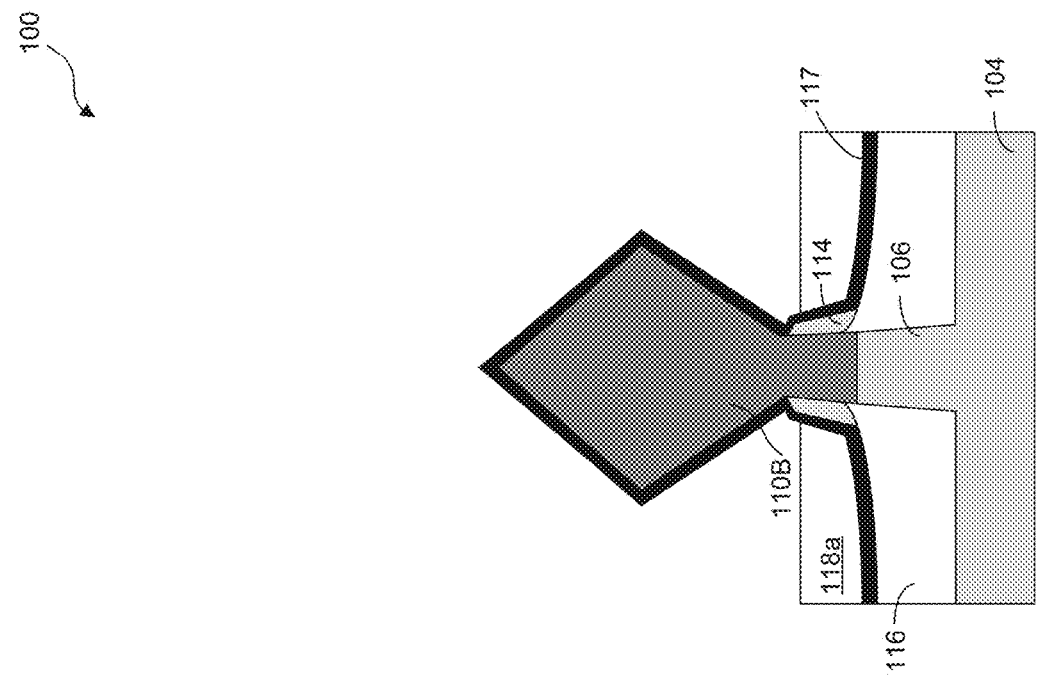
Figure 7A:
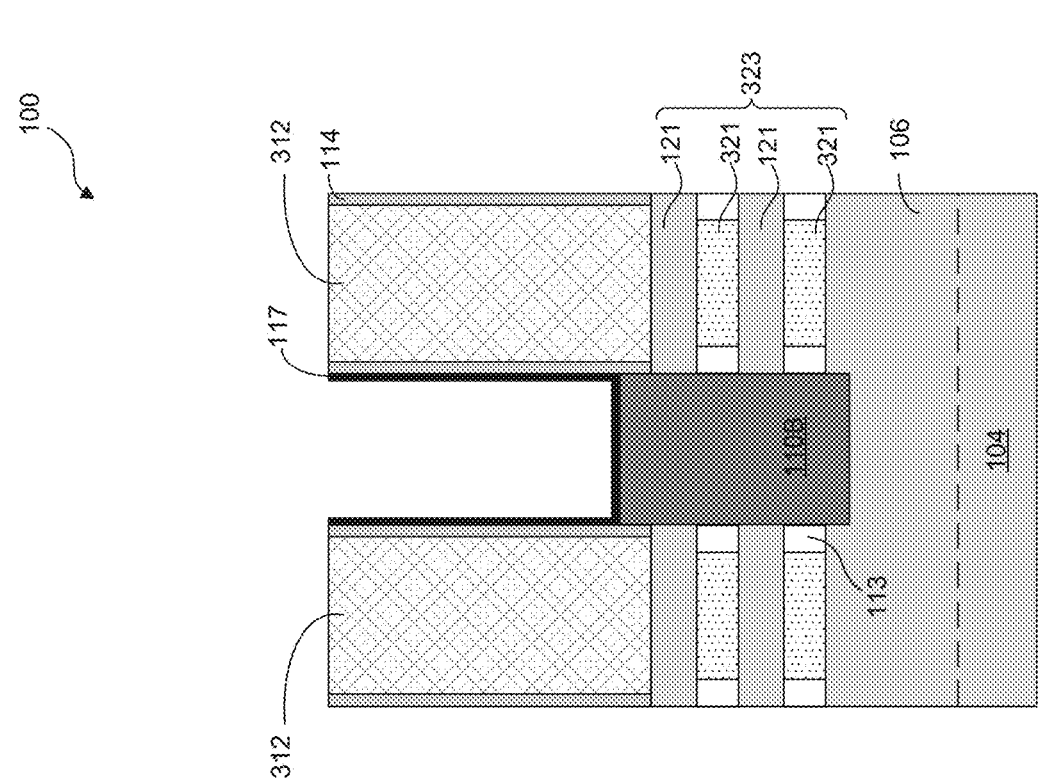

Referring to FIG. 2B, in operation 256, a high-temperature annealing process is performed on the non-flowable dielectric layer to form a densified dielectric layer. For example, as shown in FIG. 7B, densified dielectric layer 118a is formed after a high temperature annealing process. The high temperature annealing process can include annealing the structures of FIGS. 6A-6B at a temperature of about 400° C. to about 700° C. in an ambient of steam, hydrogen, argon, carbon-dioxide, nitrogen, or helium for a time period of about 1 minute to about 60 minutes to densify non-flowable dielectric layer 518a and form densified dielectric layer 118a with a carbide-to-oxide etch selectivity of about 40 to about 70, and a density of about 2.1 gm/cm$^3$ to about 4 gm/cm$^3$. In some embodiments, the high temperature annealing process can remove substantially all hydrogen atoms from non-flowable dielectric layer 518a and promote the formation of additional Si—O and/or Si—C bonds, while substantially preserving the existing Si—C and Si—O bonds in non-flowable dielectric layer 518a. As a result, densified dielectric layer 118a can have a higher material density and carbide-to-oxide etch selectivity than non-flowable dielectric layer 518a.

In some embodiments, operations 250-256 is considered as one deposition, etch, and densification cycle to form one layer of densified dielectric layer, such as densified dielectric layer 118a. In some embodiments, the deposition, etch, and densification cycle is repeated to form densified dielectric layers 118b-118g on densified dielectric layer 118a, as shown in FIGS. 8A-8B. In some embodiments, the deposition, etch, and densification cycle is repeated until a top surface of the topmost layer (e.g., densified dielectric layer 118g) of densified ILD layer 118F is substantially coplanar with top surfaces of polysilicon structures 312 or is at a higher level than the top surfaces of polysilicon structures 312.

Figure 9B:
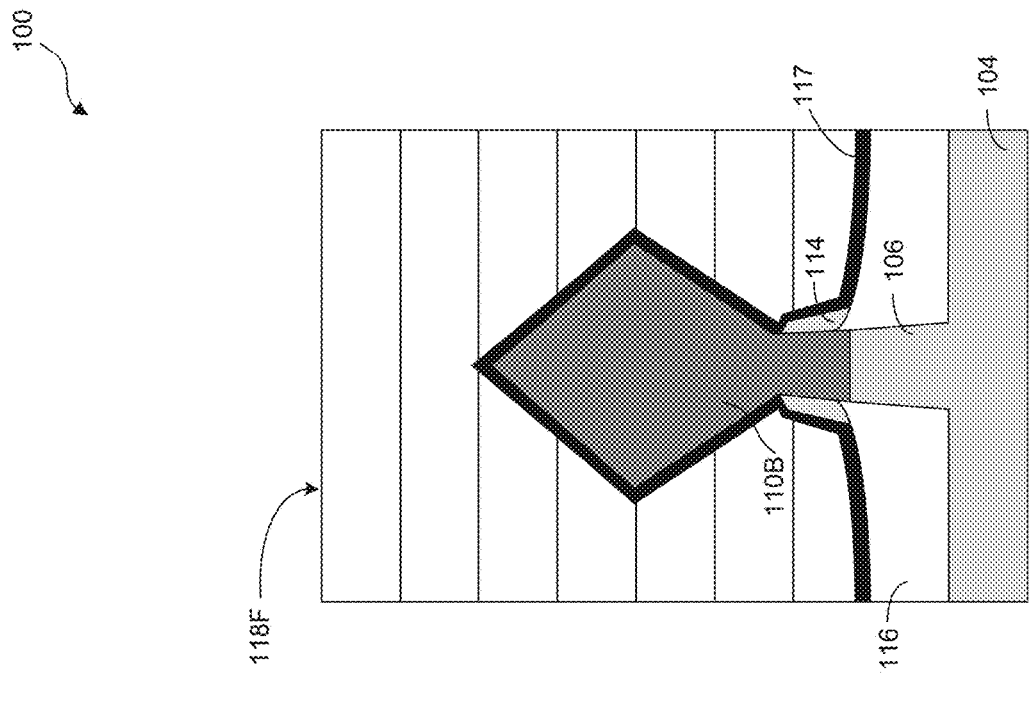
Figure 9A:
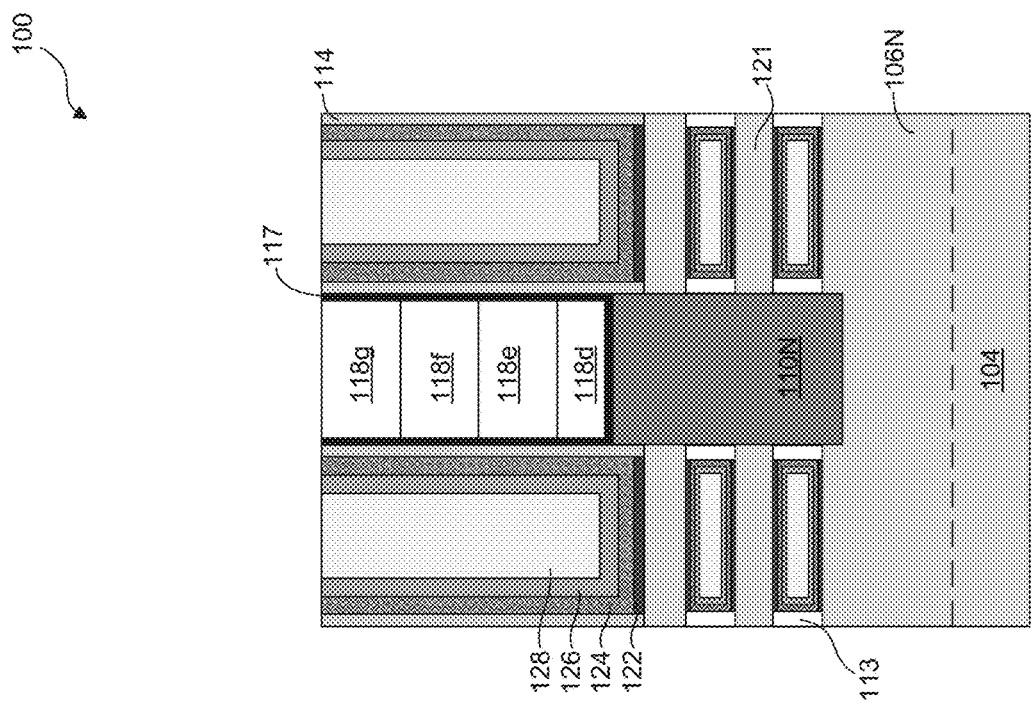

Referring to FIG. 2A, in operation 220, the polysilicon structures and sacrificial layers are replaced with gate structures. For example, as described with reference to FIGS. 9A-10B, polysilicon structures 312 and sacrificial layers 321 are replaced with gate structures 112. The formation of gate structures 112 can include sequential operations of (i) removing polysilicon structures 312 and sacrificial layers 321 from the structures of FIGS. 8A-8B to form gate openings (not shown), (ii) forming IO oxide layers 122 within the gate openings, as shown in FIGS. 9A-9B, (iii) forming HK dielectric layers 124 on IO oxide layers 122, as shown in FIGS. 9A-9B, (iv) forming WFM layers 126 on HK dielectric layers 124, as shown in FIGS. 9A-9B, (v) forming gate metal fill layers 128 on WFM layers 126, as shown in FIGS. 9A-9B, (vi) etching gate spacers 114, HK gate dielectric layers 124, WFM layers 126, and gate metal fill layers, (vii) forming conductive capping layers 130 on HK gate dielectric layers 124, WFM layers 126, and gate metal fill layers, as shown in FIGS. 10A-10B, and (viii) forming insulating capping layers 132 on conductive capping layers 130, as shown in FIGS. 10A-10B.

Figures 11A, 11B:
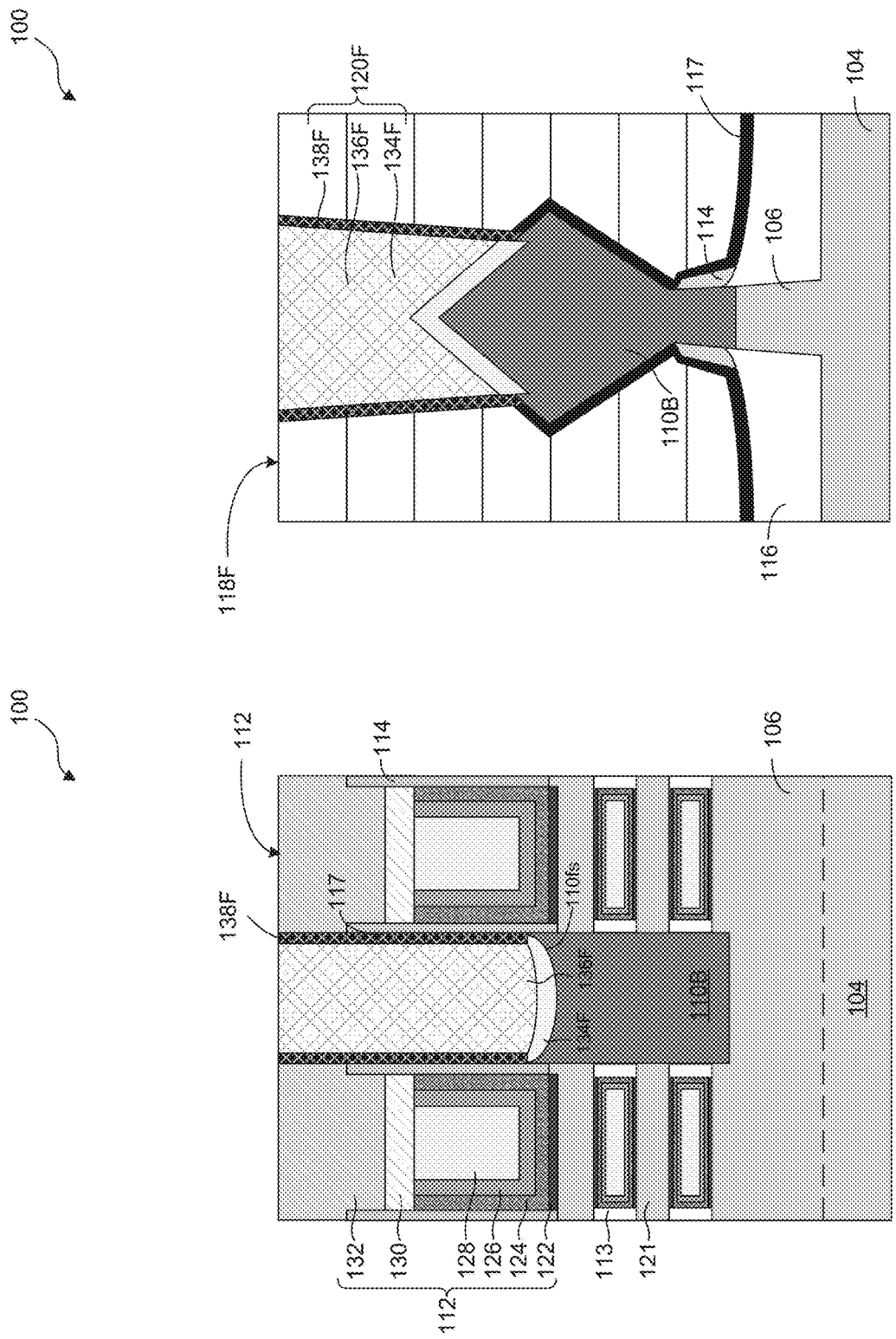

Referring to FIG. 2A, in operation 225, a front-side contact structure is formed on the S/D region. For example, as shown in FIGS. 11A-11B, front-side contact structure 120F is formed on front-side surface 110fs of S/D region 110B.

Figure 12B:
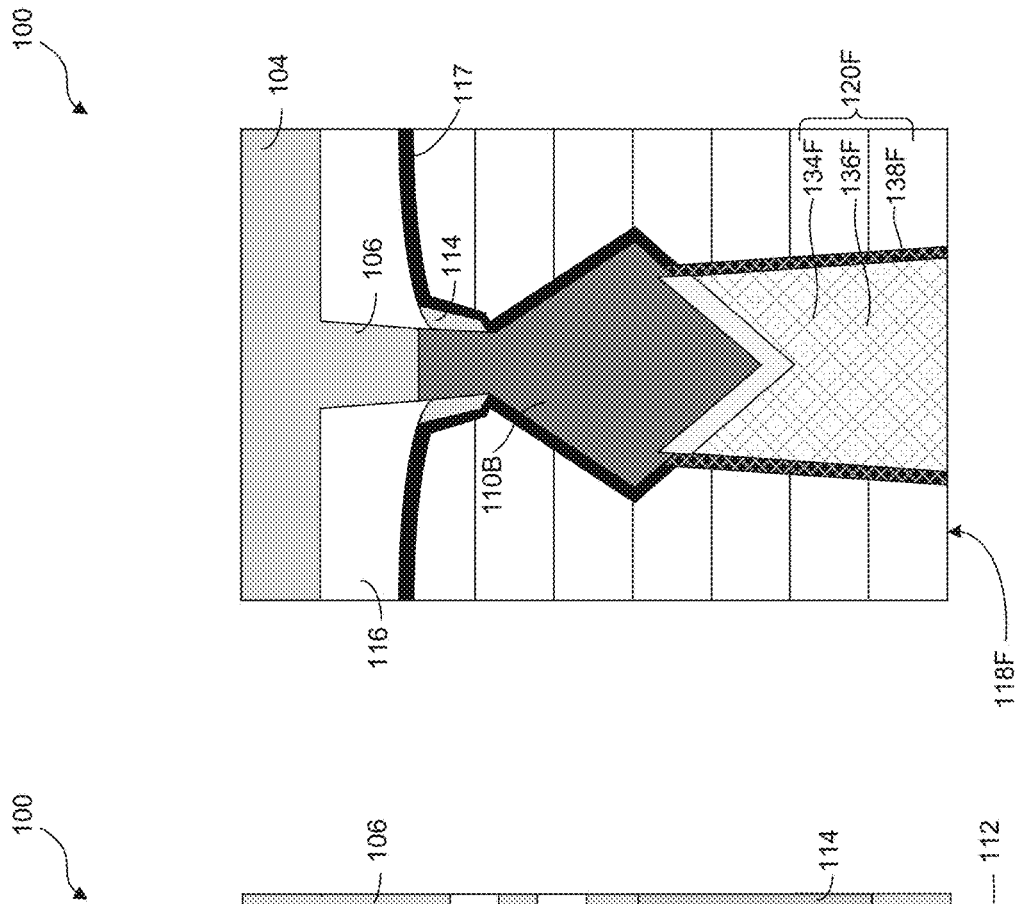
Figure 12A:
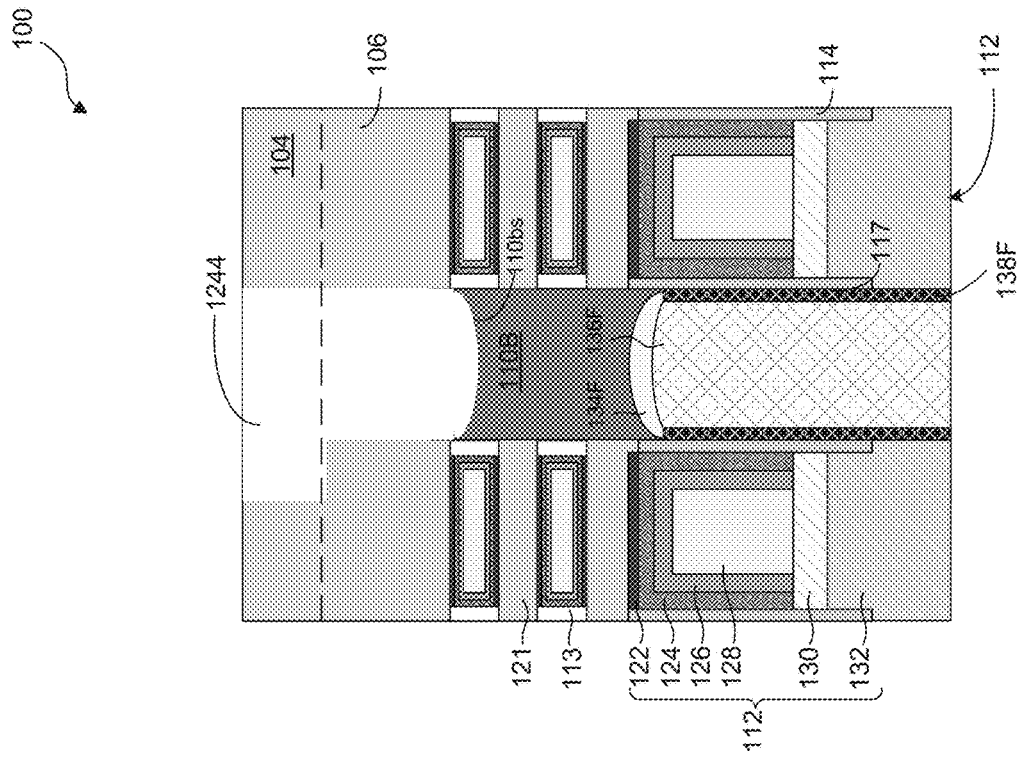
Figure 13A:
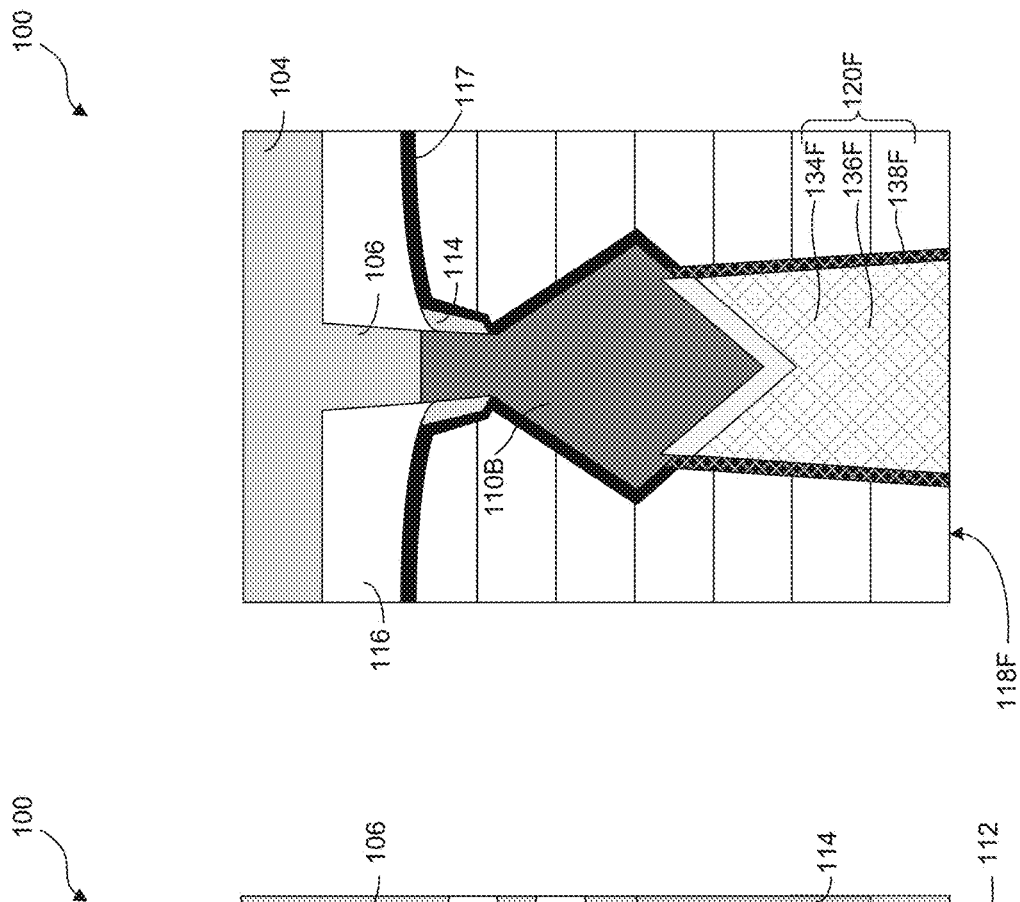
Figure 13B:
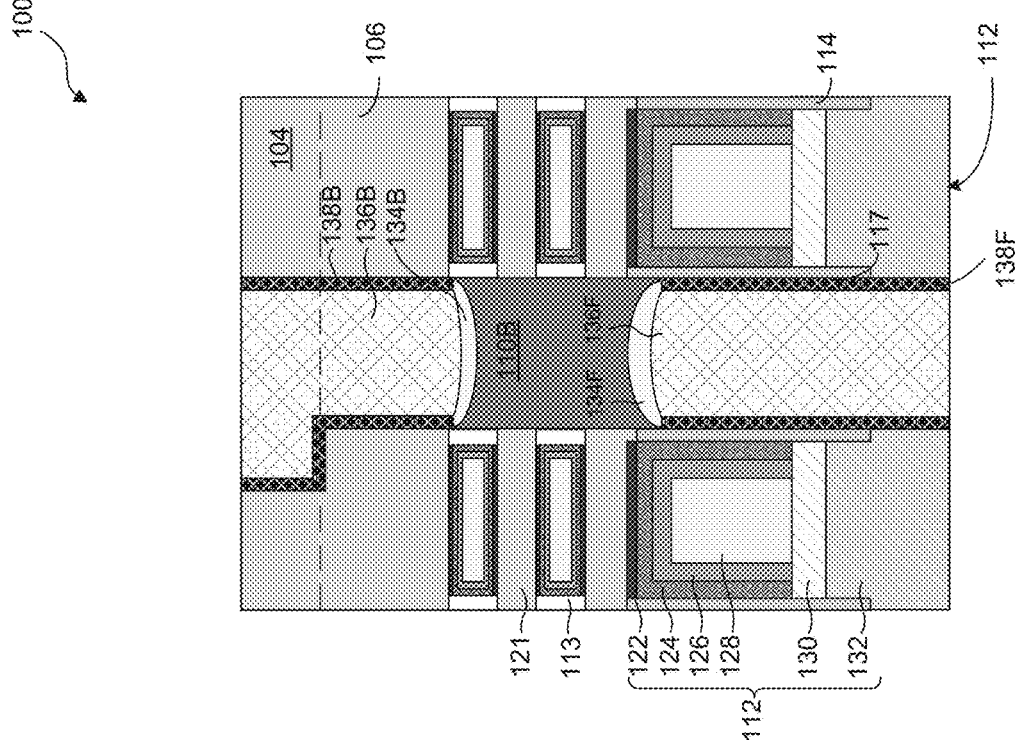
Figure 14B:
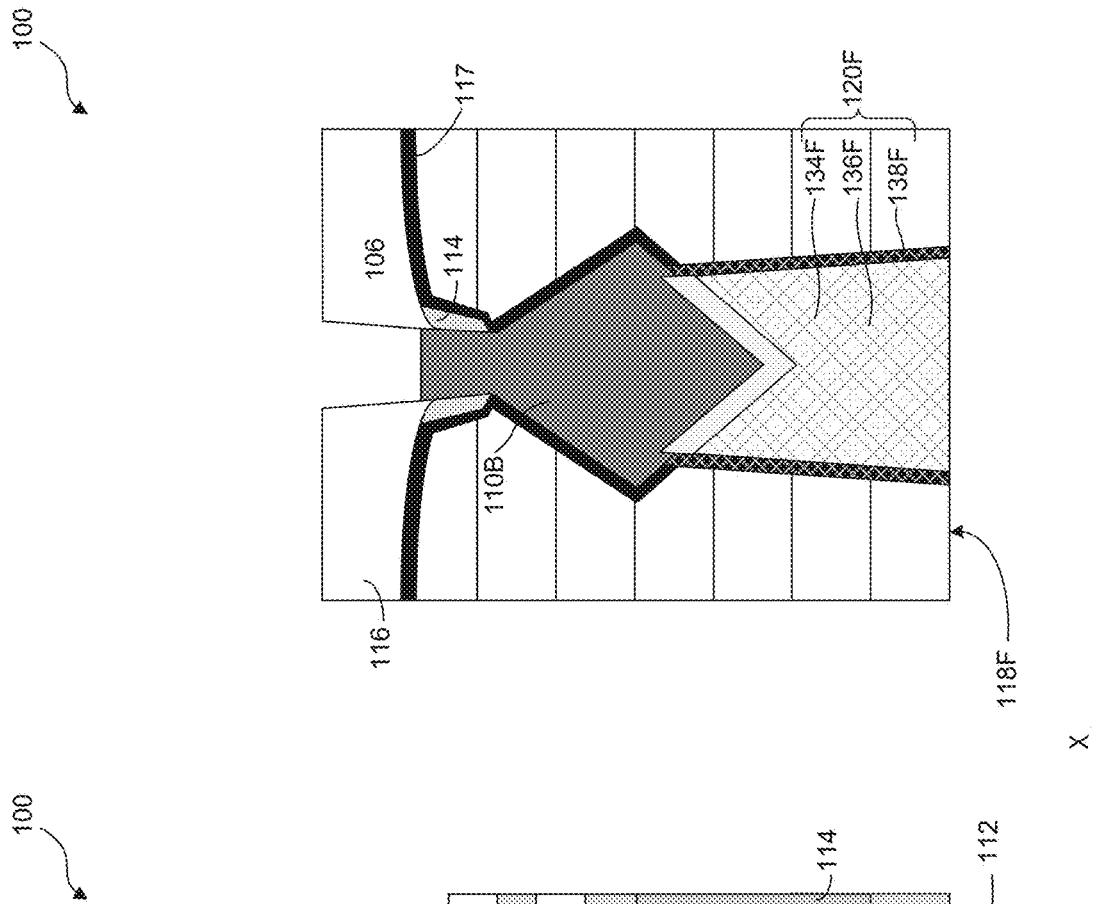
Figure 14A:
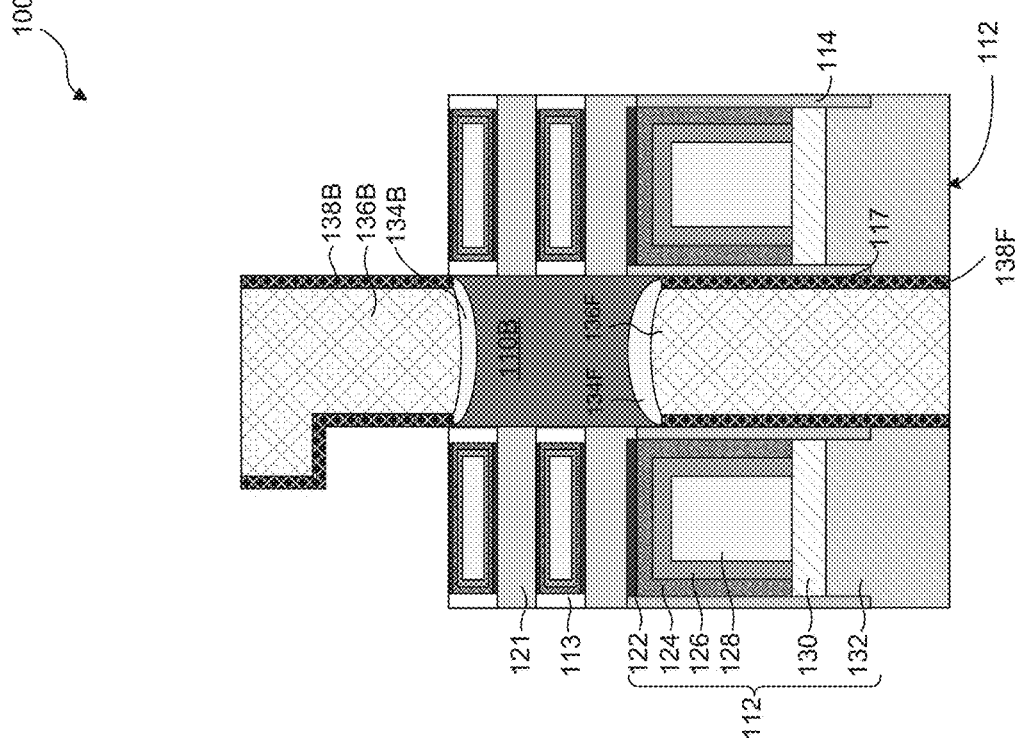
Figure 15B:
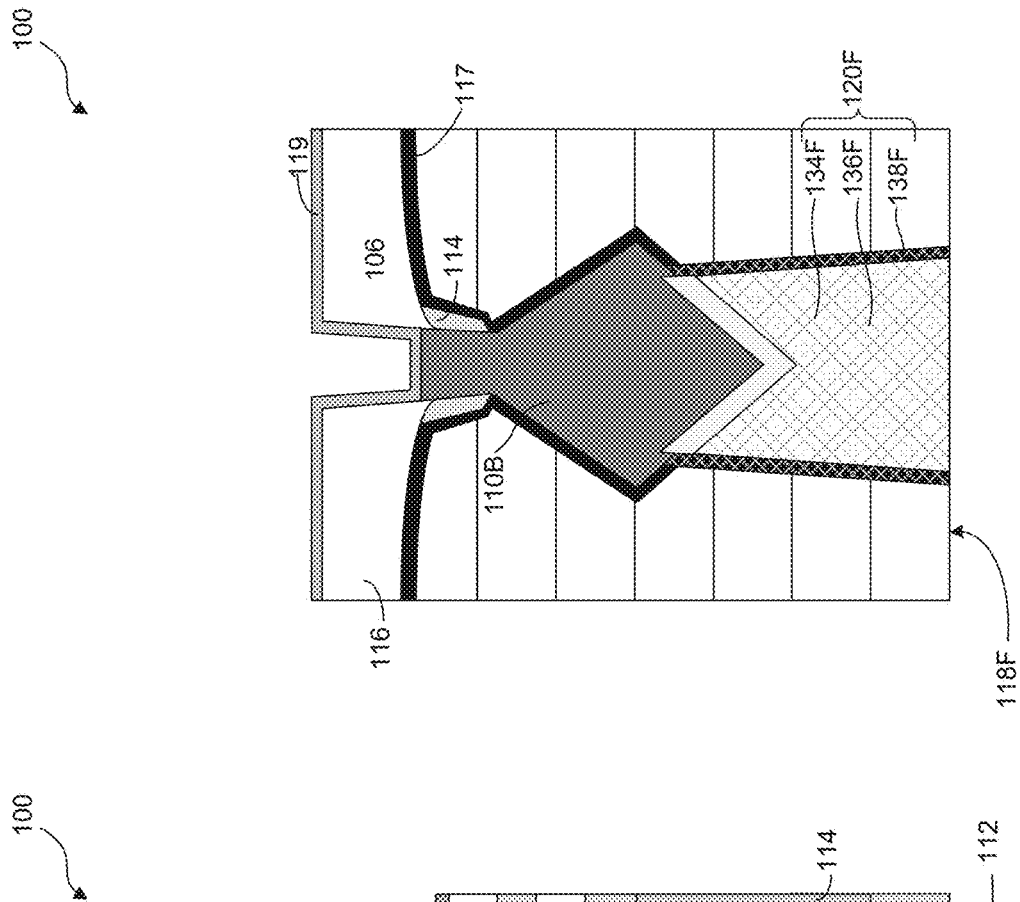
Figure 15A:
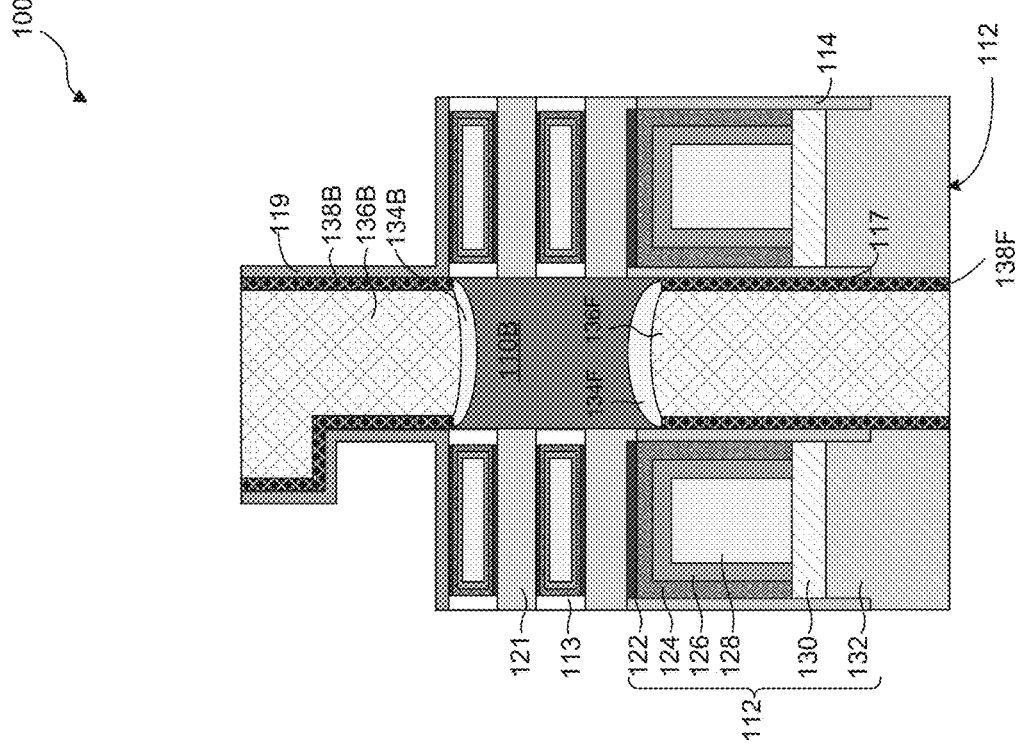

Referring to FIG. 2A, in operation 230, a back-side contact structure is formed on the S/D region. For example, as described with reference to FIGS. 12A-13B, back-side contact structure 120B is formed on back-side surface 110bs of S/D region 110B. The formation of back-side contact structure 120B can include sequential operations of (i) flipping the structures of FIGS. 11A-11B, (ii) forming a contact opening 1244 in substrate 104, as shown in FIG. 12A, (iii) forming silicide layer 134B on back-side surface 110bs, as shown in FIG. 13A, (iv) forming nitride barrier layer 138B along sidewalls of contact opening 1244, as shown in FIG. 13A, and (v) forming contact plug 136B on silicide layer 134B, as shown in FIG. 13A.

Referring to FIG. 2A, in operation 235, the substrate is removed. For example, substrate 104 is removed from the structures of FIGS. 13A-13B to form the structures of FIGS. 14A-14B.

Referring to FIG. 2A, in operation 240, a back-side barrier layer is formed along sidewalls of the back-side contact structure and back-side surfaces of the gate structures. For example, back-side barrier layer 119 is formed along sidewalls of back-side contact structure 120B and back-side surfaces of gate structures 112. The formation of back-side barrier layer 119 can include depositing a nitride layer on the structures of FIGS. 14A-14B using a CVD process or an atomic layer deposition (ALD) process to form the structures of FIGS. 15A-15B.

Referring to FIG. 2A, in operation 245, a back-side densified ILD layer is formed on the back-side barrier layer. For example, as described with reference to FIGS. 2C and 16A-19B, densified ILD layer 118B is formed on back-side barrier layer 119. Referring to FIG. 2C, in some embodiments, operation 245 can include operations 260-266 for the formation of densified ILD layer 118B.

Referring to FIG. 2C, in operation 260, a flowable dielectric layer is deposited on a back-side of the FET. For example, as shown in FIGS. 16A-16B, a flowable dielectric layer 1618 with a thickness of about 1 nm to about 10 nm is deposited. The discussion of the deposition process and precursors of flowable dielectric layer 418a in operation 250 of FIG. 2B applies to the deposition process of flowable dielectric layer 1618, unless mentioned otherwise.

Figure 17B:
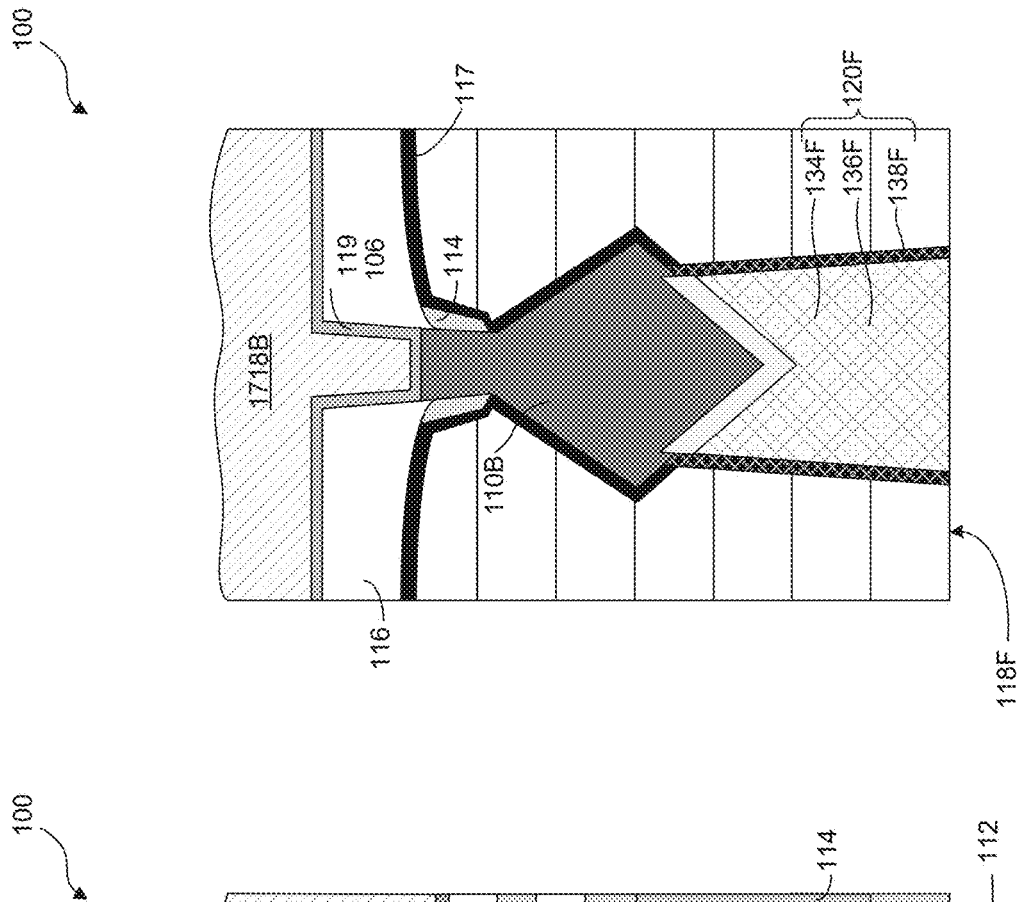
Figure 17A:
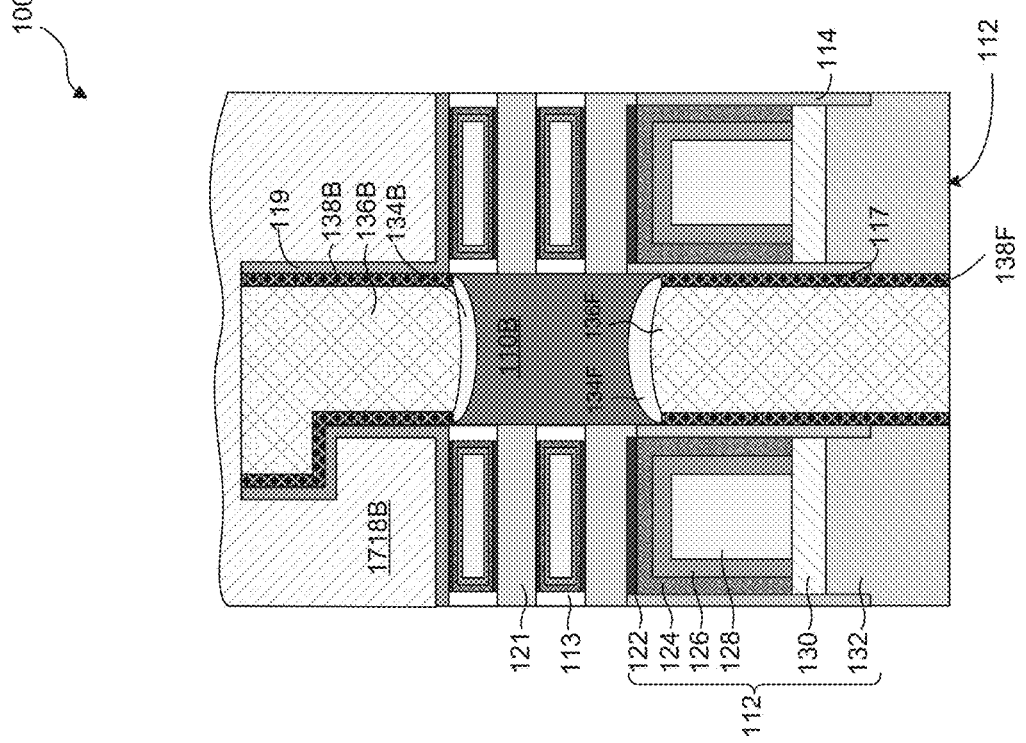

Referring to FIG. 2C, in operation 262, a plasma treatment is performed on the flowable dielectric layer to form a non-flowable dielectric layer. For example, as shown in FIGS. 17A-17B, a non-flowable dielectric layer 1718B is formed after a plasma treatment. The discussion of the plasma treatment of flowable dielectric layer 418a to form non-flowable dielectric layer 518a in operation 252 of FIG. 2B applies to the plasma treatment of flowable dielectric layer 1618 to form non-flowable dielectric layer 1718B, unless mentioned otherwise.

Referring to FIG. 2C, in operation 264, a planarization process is performed on the non-flowable dielectric layer. For example, as shown in FIGS. 18A-18B, a top surface of non-flowable dielectric layer 1718B is substantially planarized and substantially coplanarized with a top surface of back-side contact structure 120B. The planarization process can include performing a wet etching process using a wet etchant, such as dilute hydrofluoric acid (DHF) on the structures of FIGS. 17A-17B.

Referring to FIG. 2C, in operation 266, a low-temperature annealing process is performed on the non-flowable dielectric layer to form a densified dielectric layer. For example, as shown in FIG. 19A-19B, densified dielectric layer 118B is formed after a low-temperature annealing process. The low-temperature annealing process can include annealing the structures of FIGS. 17A-17B at a temperature of about 200° C. to about 400° C. in an ambient of steam, hydrogen, argon, carbon-dioxide, nitrogen, or helium for a time period of about 1 minute to about 60 minutes to densify non-flowable dielectric layer 1718B and form densified dielectric layer 118B with a carbide-to-oxide etch selectivity of about 40 to about 70, and a density of about 2.1 $gm/cm^3$ to about 4 $gm/cm^3$. Annealing within the low-temperature range protects gate structures 112 from being thermally damaged during the low-temperature annealing process.

The present disclosure provides example structures of FETs (e.g., FET 100) with densified dielectric structures (e.g., densified ILD layers 118F and 118B) configured to provide electrical isolation between adjacent structures, and example methods of forming the same substrate. In some embodiments, densified dielectric structures can be formed on front-side and back-side surfaces of the FET. In some embodiments, the densified dielectric structures can be formed on front-side surfaces of source/drain (S/D) regions (e.g., densified ILD layers 118F on S/D region 110B) and on back-side surfaces of gate structures (e.g., densified ILD layers 118B on gate structures 112). The example methods (e.g., method 200) form the densified dielectric structures with substantially uniform density across the heights and widths of the densified dielectric structures. In some embodiments, the methods can form portions of the densified dielectric structures within gaps between adjacent structures (e.g., gaps between diamond-shaped S/D regions 110B and STI 116 regions) substantially uniform with other portions of the densified dielectric structures.

In some embodiments, a method includes forming a fin structure, forming an isolation structure adjacent to the fin structure, forming a source/drain (S/D) region on the fin structure, depositing a flowable dielectric layer on the isolation structure, converting the flowable dielectric layer into a non-flowable dielectric layer, performing a densification process on the non-flowable dielectric layer, and repeating the depositing, converting, and performing to form a stack of densified dielectric layers surrounding the S/D region.

In some embodiments, a method includes forming a fin structure on a substrate, forming a source/drain (S/D) region on the fin structure, forming a gate structure on the fin structure, forming a contact structure through the substrate and on a back-side surface of the S/D region, removing the substrate to expose a back-side surface of the gate structure, depositing a flowable dielectric layer on the back-side surface of the gate structure, converting the flowable dielectric layer into a non-flowable dielectric layer, and performing a densification process on the non-flowable dielectric layer.

In some embodiments, a semiconductor device a stack of nanostructured channel regions, a gate structure surrounding each of the nanostructured channel regions, a source/drain (S/D) region adjacent to the gate structure, a first contact structure on a front-side surface of the S/D region, a second contact structure on a back-side surface of the S/D region, a first interlayer dielectric (ILD) layer surrounding the first contact structure and the S/D region, and a second ILD layer surrounding the second contact structure and on a back-side surface of the gate structure. The first ILD layer includes a stack of dielectric layers.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin structure;
    forming an isolation structure adjacent to the fin structure;
    forming a source/drain (S/D) region on the fin structure;
    depositing a flowable dielectric layer on the isolation structure;
    converting the flowable dielectric layer into a non-flowable dielectric layer;
    performing a planarization process on the non-flowable dielectric layer;
    performing a densification process on the non-flowable dielectric layer after performing the planarization process; and
    repeating the depositing, converting, and performings to form a stack of densified dielectric layers surrounding the S/D region.

2. The method of claim 1, wherein depositing the flowable dielectric layer comprises exposing the isolation structure to a silicon- and carbon-containing precursor with carbon-carbon double bonds (C=C).

3. The method of claim 1, wherein depositing the flowable dielectric layer comprises exposing the isolation structure to oxygen and nitrogen radicals.

4. The method of claim 1, wherein depositing the flowable dielectric layer comprises exposing the isolation structure to oxygen and ammonia radicals.

5. The method of claim 1, wherein converting the flowable dielectric layer into the non-flowable dielectric layer comprises performing an inductively coupled plasma treatment with helium, hydrogen, argon, or nitrogen plasma on the flowable dielectric layer.

6. The method of claim 1, wherein converting the flowable dielectric layer into the non-flowable dielectric layer comprises:
    generating a plasma of helium, hydrogen, argon, or nitrogen in an inductively coupled plasma chamber; and
    exposing the flowable dielectric layer to the plasma.

7. The method of claim 1, wherein performing the densification process on the non-flowable dielectric layer comprises performing an annealing process on the non-flowable dielectric layer at a temperature of about 400° C. to about 700° C.

8. The method of claim 1, wherein performing the densification process on the non-flowable dielectric layer comprises performing an annealing process on the non-flowable dielectric layer in an ambient of steam, hydrogen, argon, carbon-dioxide, nitrogen, or helium.

9. The method of claim 1, wherein performing the planarization process comprises performing a wet etch process on the non-flowable dielectric layer prior to performing the densification process.

10. The method of claim 1, wherein performing the planarization process comprises exposing the non-flowable dielectric layer to a dilute hydrofluoric acid solution prior to performing the densification process.

11. A method, comprising:
forming a fin structure on a substrate;
forming a source/drain (S/D) region on the fin structure;
forming a gate structure on the fin structure;
forming a contact structure through the substrate and on a back-side surface of the S/D region;
removing the substrate to expose a back-side surface of the gate structure;
depositing a flowable dielectric layer on the back-side surface of the gate structure;
converting the flowable dielectric layer into a non-flowable dielectric layer; and
performing a densification process on the non-flowable dielectric layer.

12. The method of claim 11, wherein depositing the flowable dielectric layer comprises exposing the back-side surface of the gate structure to a silicon- and carbon-containing precursor with carbon-carbon double bonds (C=C).

13. The method of claim 11, wherein converting the flowable dielectric layer into the non-flowable dielectric layer comprises performing an inductively coupled plasma treatment with helium, hydrogen, argon, or nitrogen plasma on the flowable dielectric layer.

14. The method of claim 11, wherein performing the densification process on the non-flowable dielectric layer comprises performing an annealing process on the non-flowable dielectric layer at a temperature of about 200° C. to about 400° C.

15. The method of claim 11, wherein performing the densification process on the non-flowable dielectric layer comprises performing an annealing process on the non-flowable dielectric layer in an ambient of steam, hydrogen, argon, carbon-dioxide, nitrogen, or helium.

16. The method of claim 11, further comprising forming a nitride layer along the back-side surface of the gate structure prior to depositing the flowable dielectric layer.

17. A semiconductor device, comprising:
a stack of nanostructured channel regions;
a gate structure surrounding each of the nanostructured channel regions;
a source/drain (S/D) region adjacent to the gate structure;
a first contact structure on a front-side surface of the S/D region;
a second contact structure on a back-side surface of the S/D region;
a first interlayer dielectric (ILD) layer surrounding the first contact structure and the S/D region, wherein the first ILD layer comprises a stack of first and second dielectric layers; and
a second ILD layer surrounding the second contact structure and on a back-side surface of the gate structure.

18. The semiconductor device of claim 17, wherein each of the first and second dielectric layers comprises a carbon concentration of about 30 atomic % to about atomic 50%, a silicon concentration of about 20 atomic % to about 30 atomic %, an oxygen concentration of about 25 atomic % to about 40 atomic %, and a nitrogen concentration of about 1 atomic % to about atomic %.

19. The semiconductor device of claim 17, wherein each of the first and second dielectric layers comprises a density of about 2.1 gm/cm$^3$ to about 4 gm/cm$^3$.

20. The semiconductor device of claim 17, wherein carbon and oxygen concentrations are greater in the first and second dielectric layers than carbon and oxygen concentrations at an interface between the first and second dielectric layers.

* * * * *

UNITED STATES PATENT AND TRADEMARK OFFICE
CERTIFICATE OF CORRECTION

Page 1 of 2

PATENT NO. : 12,363,933 B2
APPLICATION NO. : 17/591413
DATED : July 15, 2025
INVENTOR(S) : Lin et al.

It is certified that error appears in the above-identified patent and that said Letters Patent is hereby corrected as shown below:

On the Title Page

Column 1, Item (71), in "Applicant", Line 2, delete "Ltd," and insert -- Ltd., --, therefor.

Column 1, Item (73), in "Assignee", Line 2, delete "Ltd." and insert -- Ltd., Hsinchu (TW) --, therefor.

In the Drawings

On Sheet 4 of 21, FIG. 2C, and on the title page, the illustrative print figure, Tag "262", Line 1, delete "a a plasma" and insert -- a plasma --, therefor.

In the Specification

In Column 1, Lines 10-11, delete "63/555,785," and insert -- 63/222,785, --, therefor.

In Column 1, Line 34, delete "FIG." and insert -- FIGS. --, therefor.

In Column 4, Line 31, delete "electrically" and insert -- electrically connect --, therefor.

In Column 4, Line 49, delete "110A-11B" and insert -- 110A-110B --, therefor.

In Column 5, Line 18, delete "each." and insert -- each other. --, therefor.

In Column 6, Line 28, delete "(10)" and insert -- (IO) --, therefor.

In Column 7, Line 24, delete "for fabricating densified" and insert -- densified --, therefor.

In Column 8, Line 16, delete "(iv)" and insert -- (v) --, therefor.

Signed and Sealed this
Sixteenth Day of September, 2025

Coke Morgan Stewart
*Acting Director of the United States Patent and Trademark Office*

In Column 8, Line 31, delete "Si—Obonds," and insert -- Si—O bonds, --, therefor.

In Column 8, Line 65, delete "S—O" and insert -- Si—O --, therefor.